(12) United States Patent
Toritani

(10) Patent No.: US 10,373,643 B2
(45) Date of Patent: Aug. 6, 2019

(54) COMPONENT ACCOMMODATING BODY MANAGING APPARATUS, COMPONENT ACCOMMODATING BODY STOREROOM, AND COMPONENT STORAGE INSTRUCTING METHOD

(71) Applicant: Panasonic Intellectual Property Management Co., Ltd., Osaka (JP)

(72) Inventor: Kenichiro Toritani, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/916,530

(22) Filed: Mar. 9, 2018

(65) Prior Publication Data
US 2018/0277153 A1 Sep. 27, 2018

(30) Foreign Application Priority Data

Mar. 27, 2017 (JP) .................................. 2017-061041
Mar. 27, 2017 (JP) .................................. 2017-061042

(51) Int. Cl.
G11B 15/06 (2006.01)
G11B 15/68 (2006.01)
(Continued)

(52) U.S. Cl.
CPC ........ *G11B 15/6885* (2013.01); *G06F 3/0604* (2013.01); *G06F 3/0631* (2013.01);
(Continued)

(58) Field of Classification Search
None
See application file for complete search history.

(56) References Cited

U.S. PATENT DOCUMENTS 6,027,019 A * 2/2000 Kou .................. H05K 13/0452
235/375
9,037,912 B1 * 5/2015 Klein .................. G06Q 10/087
714/36
(Continued)

FOREIGN PATENT DOCUMENTS

JP H08-222892 A 8/1996
JP 2012-182246 A 9/2012
(Continued)

*Primary Examiner* — K. Wong
(74) *Attorney, Agent, or Firm* — Pearne & Gordon LLP

(57) ABSTRACT

A component accommodating body managing apparatus includes a preparation component extractor, a management storage, and a storage instructing unit. The storage instructing unit generates and transmits storage instruction of the component accommodating body that is stored in the component accommodating body storeroom, based on the preparing number of components, which is extracted by the preparation component extractor, and the accommodating number of components, which is stored in the management storage. Further, the storage instructing unit instructs the component accommodating body storeroom that the accommodating number of components in the component accommodating body that is to be stored in the component accommodating body storeroom henceforth satisfies the preparing number of components.

16 Claims, 18 Drawing Sheets

(51) Int. Cl.
*G06F 3/06* (2006.01)
*H05K 13/08* (2006.01)
*H05K 13/02* (2006.01)

(52) U.S. Cl.
CPC .......... *G11B 15/06* (2013.01); *G11B 15/6895* (2013.01); *H05K 13/0215* (2018.08); *H05K 13/086* (2018.08)

(56) References Cited

U.S. PATENT DOCUMENTS

| | | | |
|---|---|---|---|
| 10,045,470 B2* | 8/2018 | Sumi | H05K 13/0061 |
| 2015/0271925 A1* | 9/2015 | Mori | H05K 13/0452 |
| | | | 29/832 |
| 2016/0205819 A1* | 7/2016 | Jacobsson | H05K 13/021 |
| | | | 700/112 |
| 2016/0234985 A1* | 8/2016 | Jacobsson | H05K 13/021 |
| 2016/0345441 A1* | 11/2016 | Kou | B65H 5/28 |
| 2016/0381844 A1* | 12/2016 | Knox | H05K 3/1241 |
| | | | 29/739 |

FOREIGN PATENT DOCUMENTS

| | | |
|---|---|---|
| JP | 2013-008729 A | 1/2013 |
| JP | 2014-067121 A | 4/2014 |
| JP | 2014-197594 A | 10/2014 |

\* cited by examiner

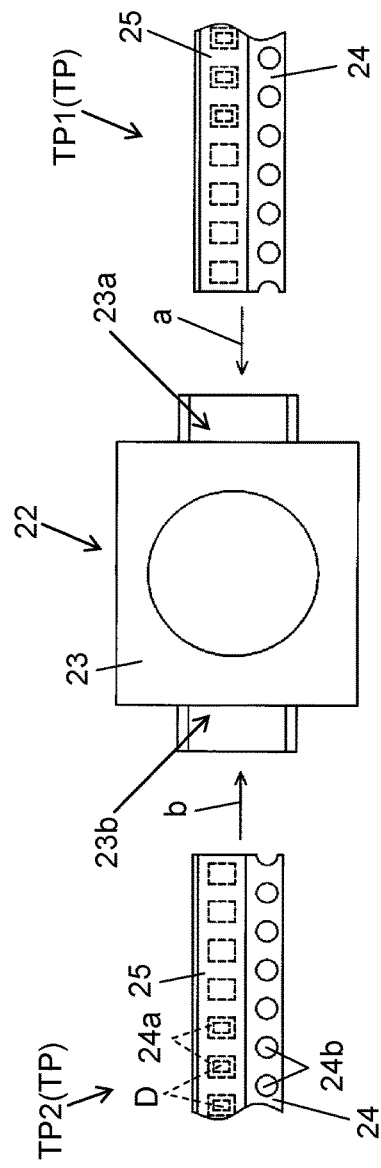
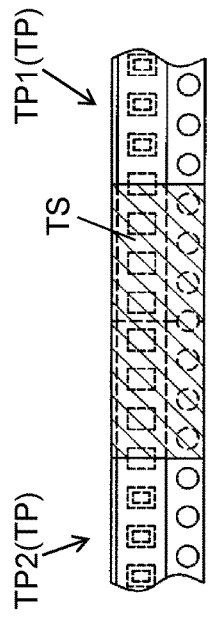
FIG. 5A
FIG. 5B

| MOUNTER COMPONENT INFORMATION | | Ima(Imb) | |
|---|---|---|---|
| REEL ID | COMPONENT TYPE | REMAINING NUMBER OF COMPONENTS | USING POSITION |
| A1 | AAAA | 200 | L(1)M(2)S(8) |
| B1 | BBBB | 500 | L(1)M(3)S(2) |
| C1 | CCCC | 600 | L(2)M(3)S(5) |
| A2 | AAAA | 700 | L(2)M(3)S(6) |
| ... | ... | ... | ... |
| ↑ 81 | ↑ 82 | ↑ 83 | ↑ 84 |

FIG. 11

| STORAGE COMPONENT INFORMATION | | | | | | | lsa(lsb) |
|---|---|---|---|---|---|---|
| REEL ID | COMPONENT TYPE | ACCOMMODATING NUMBER OF COMPONENTS | LOADING DATE | INTEGRATION REEL | SPLITTING REEL | RELATIONSHIP |
| C2 | CCCC | 500 | 2016/10/20 | | | PARENT |
| C3 | CCCC | 1500 | 2016/10/25 | C2 | | CHILD |
| D1 | DDDD | 1000 | 2016/11/12 | | D2 | PARENT |
| D2 | DDDD | 2000 | 2016/11/12 | | | CHILD |
| E1 | EEEE | 1800 | 2016/10/10 | | | |
| E2 | EEEE | 1000 | 2016/12/11 | | | |
| E3 | EEEE | 900 | 2016/12/22 | | | |
| A3 | AAAA | 1600 | 2017/01/25 | | | |
| A4 | AAAA | 1500 | 2016/12/18 | | | |
| A5 | AAAA | 400 | 2016/12/15 | | | |
| A6 | AAAA | 500 | 2016/10/24 | | | |
| B1 | BBBB | 2500 | 2017/01/09 | | | |
| B2 | BBBB | 3000 | 2016/11/19 | | | |
| ... | ... | ... | ... | ... | ... | ... |
| ↑91 | ↑92 | ↑93 | ↑94 | ↑95 | ↑96 | ↑97 |

FIG. 12

| PREPARATION COMPONENT INFORMATION | | | | ─ Ie |
|---|---|---|---|---|
| COMPONENT TYPE | PREPARING NUMBER OF COMPONENTS | USING POSITION | PREPARATION PREDICTED DATE/TIME | |
| AAAA | 1800 | L(1)M(2)S(8) | 2017/01/18 10:30 | |
| BBBB | 500 | L(1)M(3)S(2) | 2017/01/18 14:10 | |
| EEEE | 2000 | L(2)M(2)S(5) | 2017/02/14 22:40 | |
| FFFF | 1000 | L(2)M(3)S(4) | 2017/02/14 22:40 | |
| ... | ... | ... | ... | |
| ↑ | ↑ | ↑ | ↑ | |
| 101 | 102 | 103 | 104 | |

FIG. 13

| STORAGE INSTRUCTION INFORMATION | | | | | | Psa(Psb,Psc) | |
|---|---|---|---|---|---|---|---|
| REEL ID | COMPONENT TYPE | ACCOMMODATING NUMBER OF COMPONENTS | INTEGRATION REEL | SPLITTING REEL | RELATIONSHIP | USING POSITION | PREPARATION PREDICTED DATE/TIME |
| E2 | EEEE | 1000 | | | PARENT | | |
| E4 | EEEE | 1500 | E2 | | CHILD | L(2)M(2)S(5) | 2017/02/14 22:40 |
| F1 | FFFF | 2500 | | | CHILD | | |
| F2 | FFFF | 1000 | | F1 | PARENT | L(2)M(3)S(4) | 2017/02/14 22:40 |
| ... | ... | ... | ... | ... | ... | ... | ... |
| ↑ 111 | ↑ 112 | ↑ 113 | ↑ 114 | ↑ 115 | ↑ 116 | ↑ 117 | ↑ 118 |

FIG. 14

| PREPARATION INSTRUCTION INFORMATION | | | | | | Pea(Peb,Pec) | |
|---|---|---|---|---|---|---|---|
| REEL ID | COMPONENT TYPE | ACCOMMODATING NUMBER OF COMPONENTS | INTEGRATION REEL | SPLITTING REEL | RELATIONSHIP | USING POSITION | PREPARATION PREDICTED DATE/TIME |
| A4 | AAAA | 1500 | A5 | | CHILD | L(1)M(2)S(8) | 2017/01/18 10:30 |
| A5 | AAAA | 400 | | | PARENT | | |
| B3 | BBBB | 500 | | B1 | PARENT | L(1)M(3)S(2) | 2017/01/18 14:10 |
| B1 | BBBB | 2500 | | | CHILD | | |
| ... | ... | ... | ... | ... | ... | ... | ... |
| ↑ 121 | ↑ 122 | ↑ 123 | ↑ 124 | ↑ 125 | ↑ 126 | ↑ 127 | ↑ 128 | ced
COMPONENT ACCOMMODATING BODY MANAGING APPARATUS, COMPONENT ACCOMMODATING BODY STOREROOM, AND COMPONENT STORAGE INSTRUCTING METHOD

BACKGROUND

1. Technical Field

The present disclosure relates to a component accommodating body managing apparatus, a component accommodating body storeroom, and a component storage instructing method, in which entry/exit of a component accommodating body to/from a component accommodating body storeroom that stores a plurality of component accommodating bodies accommodating a plurality of components is managed.

2. Description of the Related Art

In a component supply apparatus that supplies a component to a mounter that mounts a component onto a board and produces a mounting board, a reel component formed by winding a carrier tape, in which components are housed, into a reel or a tray component, in which components are housed in a tray, is used. Such a reel component or a tray component is stored in a component accommodating body storeroom (for example, see Japanese Patent Unexamined Publication No. 2014-197594 (PTL 1)). In a reel storeroom (component accommodating body storeroom) disclosed in PTL 1, in order to effectively use a space in the reel storeroom, reels are stored, with carrier tapes of two reel components joined (spliced) into one reel component or with one reel component being split into two reel components.

SUMMARY

A component accommodating body managing apparatus of this disclosure includes a preparation component extractor, a management storage, and a storage instructing unit.

The preparation component extractor extracts a component type and a preparing number of components to be prepared, from production planning information including a component type of a component that is to be mounted on a mounting board and the production number of mounting boards.

A management storage stores a component type and an accommodating number of components, which are accommodated in a component accommodating body stored in a component accommodating body storeroom, and a component type and an accommodating number of components, which are accommodated in a component accommodating body that is to be stored in the component accommodating body storeroom henceforth.

The storage instructing unit generates and transmits storage instruction of the component accommodating body that is to be stored into the component accommodating body storeroom, based on the preparing number of components, which is extracted by the preparation component extractor, and the accommodating number of components, which is stored in the management storage.

Further, the storage instructing unit instructs the component accommodating body storeroom in such a manner that the accommodating number of components in the component accommodating body that is to be stored in the component accommodating body storeroom henceforth satisfies the preparing number of components.

In addition, a component accommodating body storeroom of this disclosure stores a plurality of component accommodating bodies which accommodate components supplied from a component supply device installed in a mounter.

The component accommodating body storeroom includes a storage instruction acquirer, a storeroom storage, a hatch, a transporter, and a controller.

The storage instruction acquirer acquires storage instruction including a component type of a component to be prepared and the preparing number of components.

The storeroom storage stores a component type and the accommodating number of components which are accommodated in the stored component accommodating body.

The component accommodating body loaded in and unloaded from the storeroom through the hatch.

The transporter transports the component accommodating body to an inside of the component accommodating body storeroom from the hatch.

The controller controls the transporter, based on the storage instruction.

Further, the controller controls the transporter so as for the component accommodating body to be transported from the hatch such that the accommodating number of components in the component accommodating body that is to be stored in the component accommodating body storeroom henceforth satisfies the preparing number of components.

In addition, a component storage instructing method of this disclosure is a method in the component accommodating body managing apparatus.

The component accommodating body managing apparatus includes a management storage that stores a component type and an accommodating number of components, which are accommodated in a component accommodating body stored in a component accommodating body storeroom, and a component type and an accommodating number of components, which are accommodated in a component accommodating body that is to be stored in the component accommodating body storeroom henceforth.

The component storage instructing method includes: a preparation component extracting step; and a storage instructing step.

In the preparation component extracting step, the component type and a preparing number of components, which are to be prepared, are extracted from production planning information including a component type of a component that is to be mounted on a mounting board and the production number of mounting boards.

In the storage instructing step, the storage instruction of the component accommodating body that is stored to be into the component accommodating body storeroom is generated and transmitted, based on the preparing number of components, which is extracted in the preparation component extracting step, and the accommodating number of components, which is stored in the management storage.

In the storage instructing step, the instruction is generated in such a manner that the accommodating number of components in the component accommodating body that is to be stored in the component accommodating body storeroom henceforth satisfies the preparing number of components.

BRIEF DESCRIPTION OF THE DRAWINGS

FIG. 5A is a diagram illustrating a function of the splicing device included in the component accommodating body storeroom of the exemplary embodiment;

FIG. 5B is a diagram illustrating the function of the splicing device included in the component accommodating body storeroom of the exemplary embodiment;

FIG. 11 is a diagram illustrating a configuration of an example of storage component information that is used in the component mounting system of the exemplary embodiment;

FIG. 12 is a diagram illustrating a configuration of an example of preparation component information that is used in the component mounting system of the exemplary embodiment;

FIG. 13 is a diagram illustrating a configuration of an example of storage instruction information that is used in the component mounting system of the exemplary embodiment;

FIG. 14 is a diagram illustrating a configuration of an example of preparation instruction information that is used in the component mounting system of the exemplary embodiment;

DETAILED DESCRIPTION

In the related art such as PTL 1, a way of use of a component after the component is taken out of a component accommodating body storeroom is not considered, and thus there is room for improvement.

Hereinafter, an exemplary embodiment of the disclosure will be described in detail with reference to the figures. A configuration, a shape, or the like, which will be described below, is an example for description and can be appropriately modified according to the specification of a component mounting system, a management computer (component accommodating body managing apparatus), and a component accommodating body storeroom. Hereinafter, the same reference signs are assigned to corresponding elements in all of the figures, and repeated description thereof is omitted.

Figure 1:
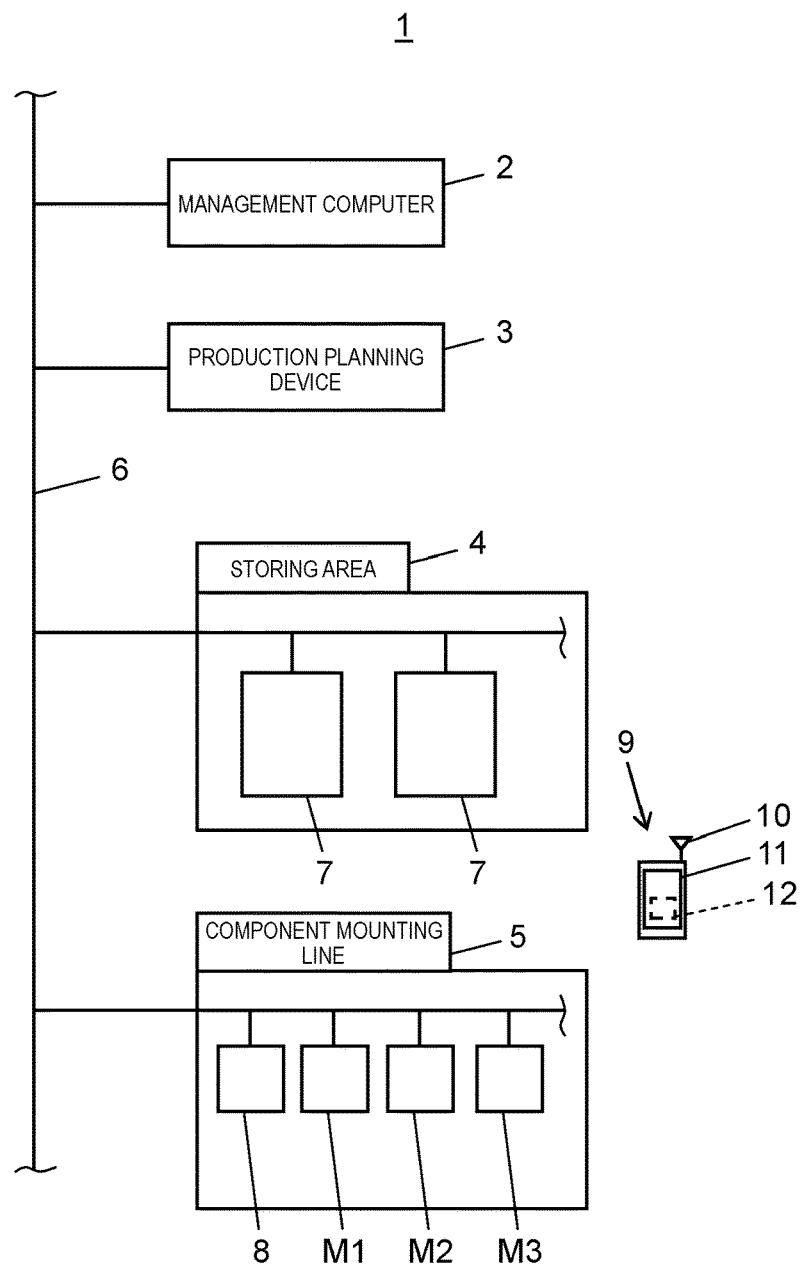
FIG. 1 is a diagram illustrating a configuration of a component mounting system of an exemplary embodiment.

First, a configuration of component mounting system 1 is described with reference to FIG. 1. FIG. 1 is a diagram illustrating the configuration of component mounting system 1 of an exemplary embodiment. Component mounting system 1 has a function of managing a component that is mounted on a board and a function of producing a mounting board by mounting the component on the board. Component mounting system 1 is configured to mainly include management computer 2, production planning device 3, storing area 4, and component mounting line 5, and the configurational members are connected via communication network 6. Management computer 2 performs management of components that are used in component mounting system 1, production management of the mounting board, and the like. Production planning device 3 generates production planning including the production number of mounting boards to be produced in component mounting system 1, production time, or the like.

Figure 2A:
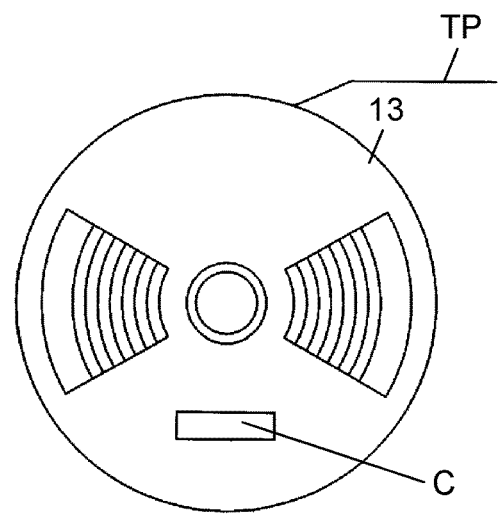
FIG. 2A is a diagram illustrating a configuration of a reel accommodating a component that is used in the component mounting system of the exemplary embodiment.
Figure 2B:
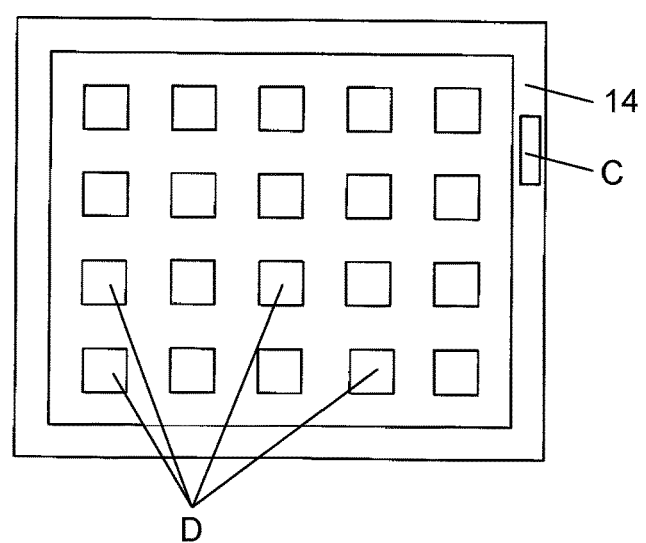
FIG. 2B is a diagram illustrating a configuration of a tray accommodating a component that is used in the component mounting system of the exemplary embodiment.

Storing area 4 includes a plurality of (here, two) component accommodating body storerooms 7 which are connected to communication network 6. Component accommodating body storeroom 7 stores a plurality of component accommodating bodies such as reel 13 (refer to FIG. 2A) or tray 14 (refer to FIG. 2B). Reel 13 holds a carrier tape TP housing the components, which is mounted on the board, in a wound state. Tray 14 houses components D in a lattice shape. Component accommodating body storeroom 7 stores reel 13 or tray 14 in which some components D are used on component mounting line 5 so as to produce the mounting board, as well as reel 13 or tray 14 in a new state in which components D are supplied from a manufacturer.

In FIG. 1, component mounting line 5 includes line managing device 8, printer M1, and mounters M2 and M3, and the devices are connected to management computer 2 via communication network 6. Printer M1 performs a solder printing job in which printing is performed with creamy solder via a mask onto a board brought in from the upstream side of a printing-job operating portion. Component supply devices are installed on mounters M2 and M3. The component supply device such as a tape feeder that supplies component D from carrier tape TP that is housed in reel 13 or a tray feeder that supplies component D that is housed in tray 14.

Mounters M2 and M3 pick up, by a suction nozzle, component D supplied from the component supply devices by a component mounting work unit, perform component mounting work of mounting component D onto the board, on which printing with creamy solder has been performed by printer M1, and produce the mounting board. As described above, the component supply device installed on mounter M2 or M3 supplies component D accommodated in the component accommodating body such as reel 13, tray 14, or the like, to mounter M2 or M3. Line managing device 8 collects information such as a remaining amount of a member such as creamy solder of printer M1, the remaining number of components D that are supplied to the component supply device of mounters M2 or M3, as well as manages work between devices of component mounting line 5.

Component mounting line 5 does not need to include two mounters M2 and M3 but may include one or three or more mounters. In addition, component mounting system 1 does not need to include one component mounting line 5, but component mounting system 1 may be configured to include a plurality of component mounting lines 5. In a case where component mounting system 1 includes a plurality of component mounting lines 5, line managing device 8 may be disposed for each component mounting line 5, or one line managing device 8 may be disposed to be common to the plurality of component mounting lines 5. In other words, information collected by line managing device 8 may be stored to be associated with information identifying the devices of component mounting line 5.

In FIG. 1, an operator who performs work with at storing area 4, component mounting line 5, or the like carries portable terminal 9. Portable terminal 9 includes terminal-side communicator 10 that performs wireless communication with management computer 2 and transmits and receives information to and from the management computer, touch panel 11 having a display function and an input function, and code reader 12. Portable terminal 9 performs display processing on the information received form management computer 2 and displays the information on touch panel 11. Code reader 12 scans identifying code C (refer to FIGS. 2A and 2B) such as a bar code or a two-dimensional code adhering to reel 13 or tray 14 and recognizes information recorded in identifying code C. Portable terminal 9 transmits various types of information recognized by code reader 12 to management computer 2, as well as information input from touch panel 11.

Figure 3:
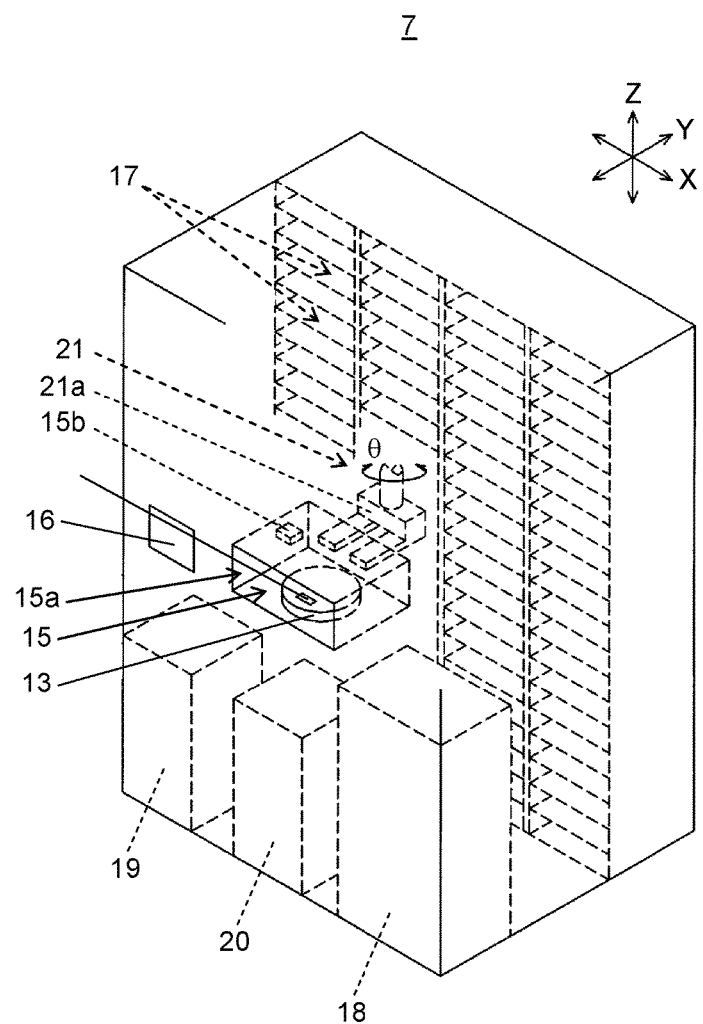
FIG. 3 is a diagram illustrating a configuration of a component accommodating body storeroom of the exemplary embodiment.

Next, a configuration of component accommodating body storeroom 7 will be described with reference to FIG. 3. FIG. 3 is a diagram illustrating the configuration of component accommodating body storeroom 7 of the exemplary embodiment. Component accommodating body storeroom 7 stores a plurality of component accommodating bodies (reels 13 and trays 14) which accommodate components D supplied from the component supply devices installed in mounters M2 and M3 that mount component D onto the board. Hereinafter, an example of component accommodating body storeroom 7 that stores reel 13 will be described. A side surface of component accommodating body storeroom 7 is provided with hatch 15a of loading/unloading processor 15 and touch panel 16 having a display function and an input function. On touch panel 16, an instruction is input by an operator to component accommodating body storeroom 7, as well as information of component D stored in component accommodating body storeroom 7 is displayed.

Reel 13 (component accommodating body) is loaded in and unloaded from component accommodating body storeroom 7 through hatch 15a. Loading/unloading processor 15 includes code reader 15b that scans identifying code C adhering to reel 13 and recognizes various types of information recorded on identifying code C. Code reader 15b recognizes various types of information recorded on identifying code C when reel 13 is loaded or unloaded.

In FIG. 3, component accommodating body storeroom 7 internally includes a plurality of storage shelves 17, integration processor 18 (integration processing means), splitting processor 19 (splitting processing means), component-empty accommodating body storage shelf 20, and transporter 21 (transport means). Reel 13 is stored on storage shelf 17. Integration processor 18 has a function of integrating a plurality of components D accommodated in a plurality of reels 13 (component accommodating bodies) to one reel 13 (component accommodating body). More specifically, integration processor 18 is splicing device 22 (splicing means) (refer to FIGS. 4, 5A, and 5B) that performs a splicing process of joining carrier tapes TP held in a plurality of respective reels 13 to be described below.

In a case where the component accommodating body is tray 14, integration processor 18 is component transfer means that transfers and integrates components D which are housed in tray 14 into another tray 14.

Splitting processor 19 has a function of splitting a plurality of components D accommodated in one reel 13 (component accommodating body) to a plurality of reels 13 (component accommodating bodies). More specifically, splitting processor 19 is tape splitting device 26 (tape splitting means) (refer to FIGS. 6, 7A, and 7B) that cuts carrier tape TP held in reel 13 (a first reel) to be described below and causes reel 13 (the first reel) and another reel 13 (a second reel) to hold the split tapes. In addition, in a case where the component accommodating body is tray 14, splitting processor 19 is component transfer means that transfers and splits components D which are housed in tray 14 (a first tray) to another tray 14 (a second tray).

In FIG. 3, component-empty accommodating body storage shelf 20 stores empty reel 13 in which component D is not accommodated. Reel 13 that is empty during the integration process is transported to component-empty accommodating body storage shelf 20. In addition, during the splitting process, empty reel 13 transported from component-empty accommodating body storage shelf 20 is used as reel 13 that holds split carrier tapes TP.

Transporter 21 includes transport head 21a that holds reel 13 and a transport head moving mechanism (not illustrated). The transport head moving mechanism causes transport head 21a to move in an X direction and a Y direction that are orthogonal to each other in a horizontal plane and in a Z direction orthogonal to the horizontal plane or causes transport head 21a to rotate in θ around a Z axis. Transporter 21 causes transport head 21a to move by the transport head moving mechanism, thereby transporting reel 13 between hatch 15a (loading/unloading processor 15), predetermined storage shelf 17, integration processor 18, splitting processor 19, and component-empty accommodating body storage shelf 20.

Figure 4:
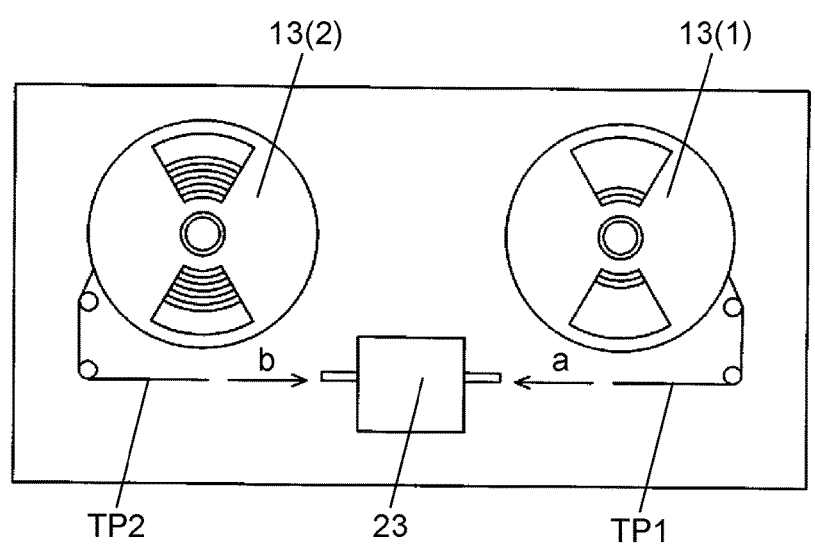
FIG. 4 is a diagram illustrating a configuration of a splicing device included in the component accommodating body storeroom of the exemplary embodiment.

Next, a configuration and a function of splicing device 22 (splicing means) will be described with reference to FIGS. 4, 5A, and 5B. FIG. 4 is a diagram illustrating the configuration of splicing device 22 included in component accommodating body storeroom 7 of the exemplary embodiment. FIGS. 5A and 5B are diagrams illustrating the function of splicing device 22 included in component accommodating body storeroom 7 of the exemplary embodiment. In FIG. 4, parent reel 13(1) holding front parent carrier tape TP1 and child reel 13(2) holding rear child carrier tape TP2 are attached to splicing device 22. During a splicing process, the rear end of front carrier tape TP1 which is pulled out from parent reel 13(1) and the front end of rear carrier tape TP2 which is pulled out from child reel 13(2) are both inserted into automatic splicer 23 (arrow a and arrow b).

Since the rear end of front carrier tape TP1 is pulled out of parent reel 13(1), a pre-process of winding front carrier tape TP1 from the front end thereof in empty reel 13 is performed in advance. When front carrier tape TP1 is wound in empty reel 13 by the pre-process, empty reel 13, in which winding is performed, is set as parent reel 13(1). In this manner, the rear end of front carrier tape TP1 is ready to be pulled out from parent reel 13(1).

Here, a structure of carrier tape TP will be described with reference to FIG. 5A. Carrier tape TP is configured to have tape main body 24 provided with component pocket 24a that houses component D and tape feed hole 24b into which a feed pin of a sprocket of a tape feeder is fitted and transparent top tape 25 bonded to component pocket 24a. Component pocket 24a and tape feed hole 24b is cyclically formed in tape main body 24. When component D that is housed in carrier tape TP is supplied by tape feeder, top tape 25 peels off and component D is exposed.

In FIG. 5A, a side surface of automatic splicer 23 is provided with front-side tape insertion opening 23a, into which the rear end of front carrier tape TP1 is inserted (arrow a), and rear-side tape insertion opening 23b, into which the front end of rear carrier tape TP2 is inserted (arrow b). When front carrier tape TP1 and rear carrier tape TP2 are inserted, automatic splicer 23 pulls front and rear carrier tapes TP1 and TP2 into the inside thereof and matches both tapes by performing a process of matching a cycle of tape feed holes 24b. Subsequently, automatic splicer 23 bonds splicing tape TS that joins front and rear carrier tapes TP1 and TP2 (refer to FIG. 5B).

After splicing tape TS is bonded, splicing device 22 winds front carrier tape TP1 in child reel 13(2). In this manner, front carrier tape TP1 is integrated (subjected to the splicing process) to rear carrier tape TP2 and both are together held in child reel 13(2).

Figure 6:
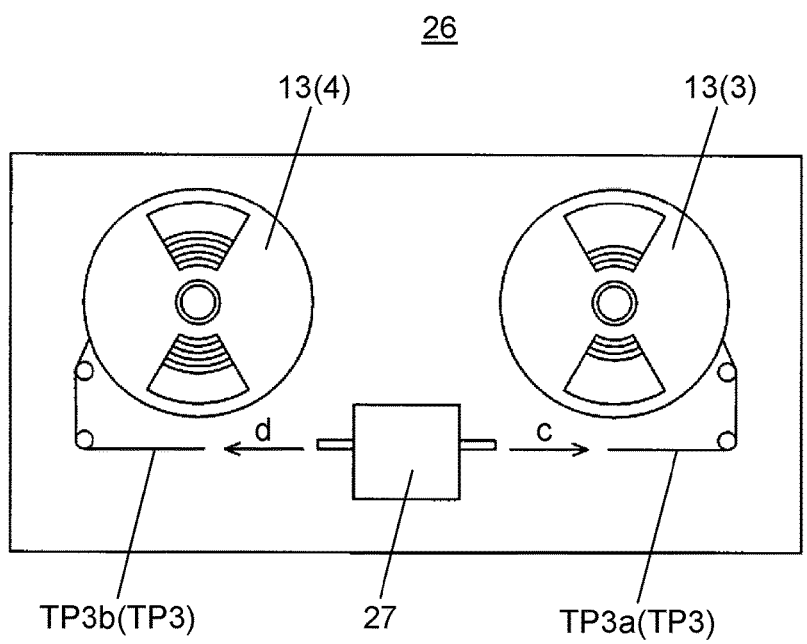
FIG. 6 is a diagram illustrating a configuration of a tape splitting device included in the component accommodating body storeroom of the exemplary embodiment.
Figure 7A:
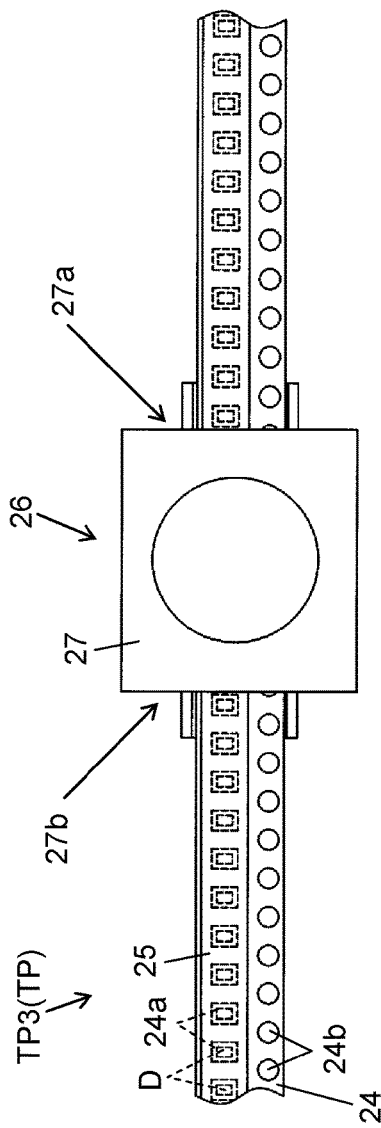
FIG. 7A is a diagram illustrating a function of the tape splitting device included in the component accommodating body storeroom of the exemplary embodiment.
Figure 7B:
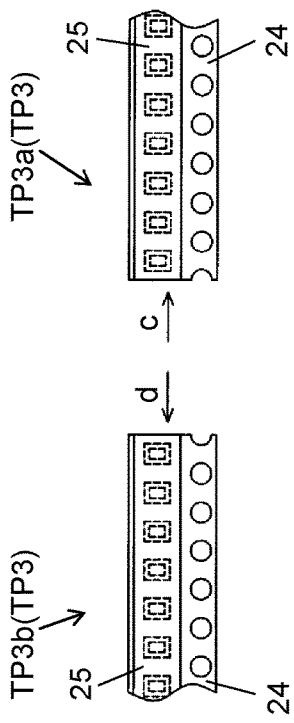
FIG. 7B is a diagram illustrating the function of the tape splitting device included in the component accommodating body storeroom of the exemplary embodiment.

Next, a configuration and a function of tape splitting device 26 (tape splitting means) will be described with reference to FIGS. 6, 7A, and 7B. FIG. 6 is a diagram illustrating the configuration of tape splitting device 26 included in component accommodating body storeroom 7 of the exemplary embodiment. FIGS. 7A and 7B are diagrams illustrating the function of tape splitting device 26 included in component accommodating body storeroom 7 of the exemplary embodiment. In FIG. 6, child reel 13(4) holding splitting target carrier tape TP3 and parent reel 13(3) holding the front side of carrier tape TP3 after splitting are attached to tape splitting device 26. As illustrated in FIG. 7A, the front end of splitting target carrier tape TP3 is inserted from rear-side tape insertion opening 27b of automatic splitter 27, the front end is pulled out from front-side tape insertion opening 27a, and then the front side of carrier tape TP3 is wound in empty parent reel 13(3).

After the front side of carrier tape TP3 is wound such that the predetermined accommodating number of components D are accommodated in parent reel 13(3), automatic splitter 27 cuts carrier tape TP3 (refer to FIG. 7B). In FIG. 6, front carrier tape TP3a after the cutting is wound in parent reel 13(3) (arrow c), and rear carrier tape TP3b is wound in child reel 13(4) (arrow d). In this manner, the front side (carrier tape TP3a) of splitting target carrier tape TP3 is split and accommodated in parent reel 13(3), and the rear side (carrier tape TP3b) is split and accommodated in child reel 13(4).

Since the rear end of front carrier tape TP3a is pulled out of parent reel 13(3), a pre-process of winding front carrier tape TP3a from the rear end thereof in empty reel 13 is performed in advance. When front carrier tape TP3a is wound in empty reel 13 by the pre-process, empty reel 13, in which winding is performed, is set as parent reel 13(3). In this manner, the rear end of front carrier tape TP1 is ready to be pulled out from parent reel 13(3).

Figure 8:
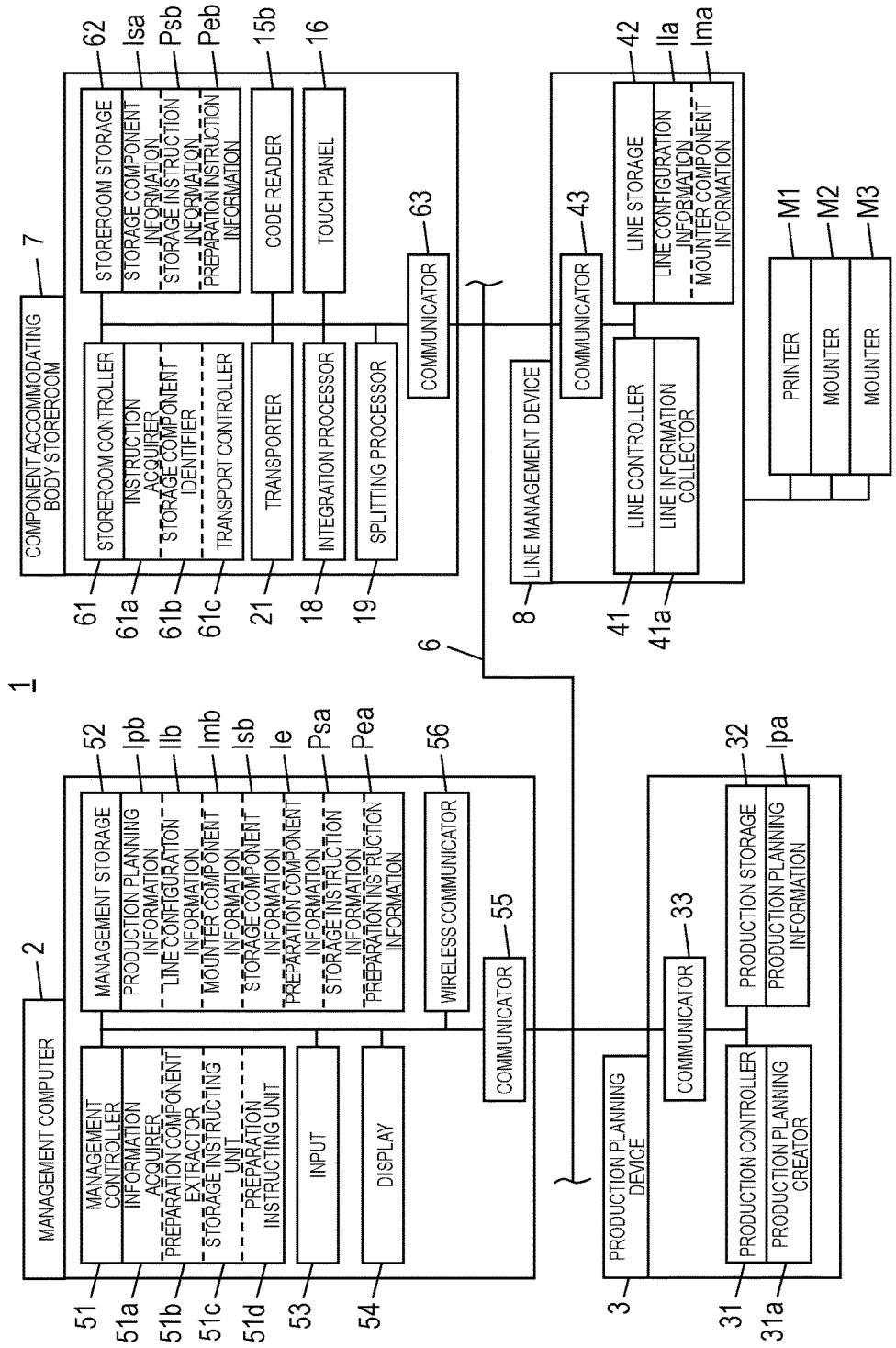
FIG. 8 is a block diagram illustrating a configuration of a control system of the component mounting system of the exemplary embodiment.

Next, a configuration of a control system of component mounting system 1 will be described with reference to FIG. 8. FIG. 8 is a block diagram illustrating the configuration of the control system of component mounting system 1 of the exemplary embodiment. Production planning device 3 includes production controller 31, production storage 32, and communicator 33. Communicator 33 is a communication interface and transmits and receives a signal or information to and from management computers 2 via communication network 6. Production controller 31 is a calculation device having a function of a CPU and includes an internal processor such as production planning generator 31a. Production storage 32 is a storage device and stores production planning information Ipa or the like.

Production planning generator 31a generates production planning information Ipa including the production number of mounting boards and a component type of components D that are mounted on a mounting board which are produced by mounters M2 and M3, based on information stored in production storage 32 and information acquired from database (not illustrated) that is connected to communication network 6, and the production planning generator 31a stores the production planning information in production storage 32. The component type of components D is information for identifying at least a type of component D.

In FIG. 8, line managing device 8 includes line controller 41, line storage 42, and communicator 43. Communicator 43 is a communication interface and transmits and receives a signal or information to and from management computers 2 via communication network 6. Line controller 41 is a calculation device having a function of a CPU and includes an internal processor such as line information collector 41a. Line storage 42 is a storage device and stores line configuration information Ila, mounter components information Ima, or the like. Line configuration information Ila includes information for identifying printer M1 or mounter M2 or M3 included in component mounting line 5, information and models for identifying a component supply device included in mounter M2 or M3, or the like.

Line information collector 41a collects information of the component type, the remaining number, and the like of components D that are supplied by the component supply devices installed in mounters M2 and M3 included in component mounting line 5, and the like and stores the information as mounter component information Ima in line storage 42. In other words, mounter component information Ima includes the component type and the remaining number of components D that are accommodated in the component accommodating bodies (reels 13 and trays 14) accommodating components D which are supplied from the component supply devices (the tape feeders and the tray feeders) installed in mounters M2 and M3 included. Mounter component information Ima is sequentially updated by line information collector 41a.

Figures 9, 10:
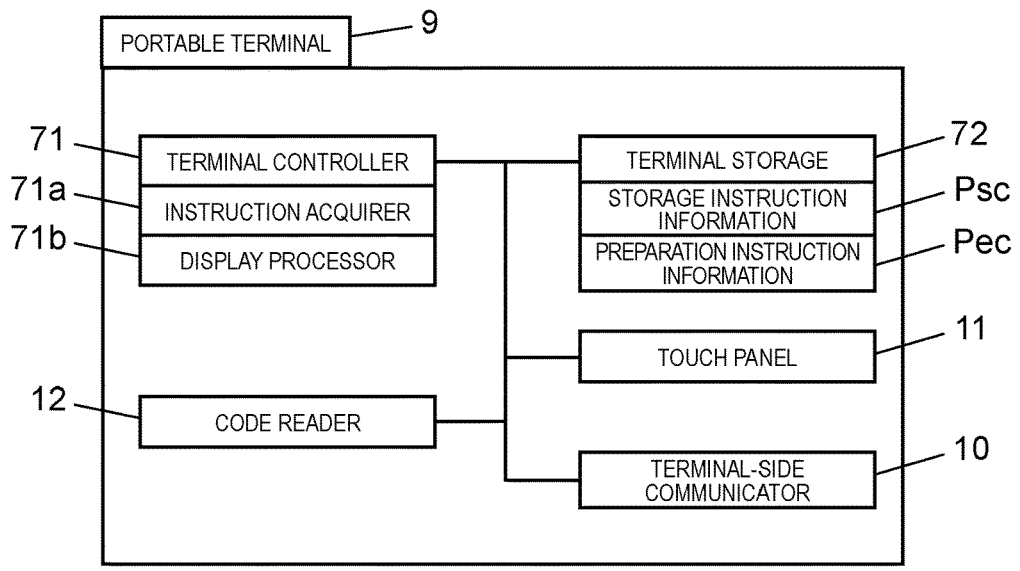
FIG. 9 is a block diagram illustrating a configuration of a control system of a portable terminal that is used in the component mounting system of the exemplary embodiment.
FIG. 10 is a diagram illustrating a configuration of an example of mounter component information that is used in the component mounting system of the exemplary embodiment.

Here, with reference to FIG. 10, an example of mounter component information Ima (Imb) of reel 13 (the component accommodating body) accommodating components D that are supplied from tape feeders (S(1), S(2), ... ) installed in mounters M2 and M3 (M(2) and M(3)) included in two respective rows of component mounting lines 5 (L(1) and L(2)) is described. FIG. 10 is a diagram illustrating a configuration of the example of mounter component information Ima (Imb) that is used in component mounting system 1 of the exemplary embodiment. In this example, mounter component information Ima includes reel ID for identifying reel 13 in "reel ID" column 81, a component type of component D in "component type" column 82, the remaining number of components D that are housed in reel 13 in "remaining number of components" column 83, and information for identifying a position at which the tape feeder (component supply device) is installed (hereinafter, referred to as a "component using position") in "using position" column 84. Here, mounter component information Ima is resorted and displayed in descending order of the remaining number of components.

In FIG. 8, management computer 2 includes management controller 51, management storage 52, input 53, display 54, communicator 55, and wireless communicator 56. Input 53 is an input device such as a keyboard, a touch panel, or a mouse and is used during an operating command or data input. The display 54 is a display device such as a liquid crystal panel and displays various types of information, as well as an operating screen for performing an operation by input 53. Communicator 55 is a communication interface and transmits and receives a signal or information to and from production planning device 3, component accommodating body storeroom 7, and line managing device 8 via communication network 6. Wireless communicator 56 performs wireless communication with portable terminal 9 and transmits and receives information.

Management controller 51 is a calculation device having a function of a CPU and includes internal processors such as information acquirer 51*a*, preparation component extractor 51*b*, storage instructing unit 51*c*, and preparation instructing unit 51*d*. Management storage 52 is a storage device and stores production planning information Ipb, line configuration information Ilb, mounter component information Imb, storage component information Isb, preparation component information Ie, storage instruction information Psa, preparation instruction information Pea, and the like. Information acquirer 51*a* acquires production planning information Ipa from production planning device 3, line configuration information Ila and mounter component information Ima from line managing device 8, and storage component information Isa from component accommodating body storeroom 7, and stores production planning information Ipb, line configuration information Ilb, mounter component information Imb, and storage component information Isb to management storage 52.

Line configuration information Ilb includes information for identifying printer M1 or mounters M2 and M3 included in component mounting line 5, information and models for identifying the component supply device included in mounters M2 and M3, or the like. In other words, management storage 52 stores a model of the component supply device that supplies component D accommodated in the component accommodating body (reel 13 or tray 14) to mounter M2 or M3. Mounter component information Imb includes the component type, the remaining number, and the like of components D that are supplied by the component supply devices installed in mounters M2 and M3 included in component mounting line 5 (refer to FIG. 10).

Storage component information Isb includes the component type and the accommodating number of components D that are accommodated in the component accommodating body (reel 13 or tray 14) which is stored in component accommodating body storeroom 7. In other words, management storage 52 stores the component type and the accommodating number of components D that are accommodated in the component accommodating body which is stored in component accommodating body storeroom 7 that stores a plurality of component accommodating bodies.

Storage component information Isb may include component supplier (vendor) information. The same component type from different component suppliers may have a difference in shape or properties of the components, and thus the integration process cannot be performed in some cases. Therefore, the storage component information further includes the component supplier information, and thereby it is possible to set whether or not the integration process can be performed on the same component type of components D, based on the component supplier information. In addition, in a case where a plurality of component accommodating body storerooms 7 are provided, storage component information Isb may include information of component accommodating body storeroom 7 storing the component, that is, storage position information.

Here, an example of storage component information Isb (Isa) of component accommodating body storeroom 7 storing reel 13 is described with reference to FIG. 11. FIG. 11 is a diagram illustrating a configuration of an example of storage component information Isb (Isa) that is used in component mounting system 1 of the exemplary embodiment. In this example, storage component information Isb includes reel ID in "reel ID" column 91, a component type of component D in "component type" column 92, and the accommodating number of components D that are housed in reel 13 in "accommodating number of components" column 93. Further, storage component information Isb includes loading date of reel 13 in "loading date" column 94, reel ID of parent reel 13 that is subjected to the integration process in "integration reel" column 95, reel ID of child reel 13 that is subjected to the splitting process in "splitting reel" column 96, and a parent-child relationship in the integration process or the splitting process in "relationship" column 97.

The loading data in "loading date" column 94 may be a loading date on which component D that is accommodated in reel 13 is brought (arrived) in storing area 4, as well as the loading data on which reel 13 is stored in component accommodating body storeroom 7. In addition, in a case of component D with an expiration date, storage component information Isb may include the expiration date.

When the integration process is performed, components D of parent reel 13 (C2) are integrated to child reel 13 (C3). Therefore, the accommodating number of components that are accommodated in child reel 13(C3) is actually the accommodating number of components (2,000) obtained by adding the accommodating number of components (500) of parent reel 13 having reel ID of C2 to the accommodating number of components (1,500) of child reel 13 having reel ID of C3. In addition, the accommodating number of components that are accommodated in parent reel 13(C2) is actually zero, and thus component D is not accommodated therein.

When the splitting process is performed, some components D that are accommodated in child reel 13 (D2) is split to parent reel 13 (D1). Therefore, the accommodating number of components that are accommodated in parent reel 13(D1) is the accommodating number of components (1,000) of the reel having reel ID of D1. In addition, the accommodating number of components that are accommodated in child reel 13(D2) is actually the accommodating number of components (1,000) obtained by subtracting the accommodating number of components (1,000) of parent reel 13 having reel ID of D1 from the accommodating number of components (2,000) of child reel 13 having reel ID of D2.

In FIG. 8, preparation component extractor 51*b* extracts the component type and the preparing number of components D that are prepared to be supplied to mounters M2 and M3 and stores the information as preparation component information Ie in management storage 52. In a case of a mounting board as a new type of board, preparation component extractor 51b extracts preparation component information Ie, based on the production number of mounting boards and the component type of components D that are mounted on the mounting board, which are included in production planning information Ipb.

In addition, in a case of supplied components of the mounting board currently under production, preparation component extractor 51b extracts preparation component information Ie, based on the component type and the remaining number of components D that are accommodated in the component accommodating body (reel 13 or tray 14) accommodating components D which are supplied from the component supply device (the tape feeder or the tray feeder) installed in mounter M2 or M3, which are included in mounter component information Ima, as well as production planning information Ipb. In other words, preparation component extractor 51b extracts the component type and the preparing number of components D to be prepared, from at least any one of production planning information Ipb and mounter component information Imb.

Here, an example of preparation component information Ie is described with reference to FIG. 12. FIG. 12 is a diagram illustrating a configuration of an example of preparation component information Ie that is used in component mounting system 1 of the exemplary embodiment. In this example, preparation component information Ie includes the component type of components D to be prepared, in "component type" column 101, the preparing number of components D to be prepared, in "preparing number of component" column 102, the component using position of components D to be prepared, in "using position" column 103, and a predicted date on which component D is required, in "preparation predicted date" column 104. In this example, the components D having the component type of "AAAA" and "BBBB" are supplied components of the mounting board currently under production, and the components D having the component type of "EEEE" and "FFFF" are components D which will be used for a board type of mounting board which will be produced next time.

In FIG. 8, storage instructing unit 51c generates a storage instruction of the component accommodating body that is stored in component accommodating body storeroom 7 such that the accommodating number of components of the component accommodating body that is to be stored henceforth satisfies the preparing number of components. The storage instruction is generated, based on the component type and the preparing number of components D to be prepared, which are included in preparation component information Ie, the component type and the accommodating number of components D that are stored, which are included in storage component information Isb, and the component type and the accommodating number of components D that are accommodated in the component accommodating bodies (reel 13 and tray 14) to be stored henceforth. Storage instructing unit 51c stores the storage instruction as storage instruction information Psa in management storage 52. In addition, storage instructing unit 51c transmits generated storage instruction information Psa (storage instruction) to component accommodating body storeroom 7 and portable terminal 9 via communicator 55.

Here, an example of storage instruction information Psa (Psb or Psc) is described with reference to FIG. 13. FIG. 13 is a diagram illustrating a configuration of an example of storage instruction information Psa (Psb or Psc) that is used in component mounting system 1 of the exemplary embodiment. In this example, storage instruction information Psa includes reel ID in "reel ID" column 111, the component type of components D in "component type" column 112, and the accommodating number of components D that are housed in reel 13 which is accommodated or is to be accommodated henceforth in "accommodating number of components" column 113. Further, storage instruction information Psa includes reel ID of parent reel 13 that is subjected to the integration process in "integration reel" column 114, reel ID of child reel 13 that is subjected to the splitting process in "splitting reel" column 115, a parent-child relationship in the integration process or the splitting process in "relationship" column 116, the component using position of components D to be prepared, in "using position" column 117, and a predicted date on which component D is required, in "preparation predicted date" column 118.

As described above, management storage 52 stores reels 13 stored in component accommodating body storeroom 7, which stores a plurality of reels 13 (component accommodating body) accommodating components D, and the component type and the accommodating number of components D accommodated in reel 13 to be stored henceforth. The integration process is not limited to the integration of two reels 13 (the parent and the child), and three or more reels 13 (the parent, the child, the grandchild, the great-grandchild, . . . ) may be integrated. In addition, in the splitting process, one reel 13 may be split into three or more reels 13. In this case, information corresponding to the grandchild (great-grandchild, . . . ) is stored in "integration reel" column 114, "splitting reel" column 115, and "relationship" column 116.

In FIG. 13, in this example, storage instruction that the reel ID to be stored in component accommodating body storeroom 7 henceforth correspond to reels 13 of E4 and F1 is included. Reel 13 (E4) with the reel ID of E4 has the accommodating number of components of 1,500 and does not satisfy the preparing number of components of 2,000 of the component type of "EEEE" included in preparation component information Ie (refer to FIG. 12). Storage instructing unit 51c instructs that the integration process is performed on reel 13 (E4) (component accommodating body) and reel 13 that is stored in component accommodating body storeroom 7 or reel 13 (another component accommodating body) to be stored therein henceforth.

As shown in storage component information Isb (refer to FIG. 11), component accommodating body storeroom 7 stores reel 13 (E1) having 1,800 components, reel 13 (E2) having 1,000 components, and reel 13 (E3) having 900 components in the accommodation component number. When reel 13 (E4) is subjected to the integration process with reel 13 (E1), the accommodating number of components is 3,300 and exceeds the limit accommodation number (3,000 components), and thus reel 13 (E1) is not selected as reel 13 to be subjected to the integration process. In a case where reel 13 having the component type of "EEEE" except for reel 13 (E1) is stored in component accommodating body storeroom 7, storage instructing unit 51c instructs that reel 13 (E4) is to be stored as it is without being subjected to the integration process.

In other words, in a case where a total (3,300 components) of the accommodating number of components (1,500) of reel 13 (E4) (component accommodating body) to be stored henceforth and the accommodating number of components (1,800) of reel 13 (E1) (another component accommodating body) exceeds the limit accommodation number (3,000 components), storage instructing unit 51c instructs that reel 13 (E4) (corresponding component accommodating body) is to be stored as it is.

When reel 13 (E4) is subjected to the integration process with reel 13 (E2) or reel 13 (E3), the accommodating number of components is 2,500 or 2,400, respectively, and thus satisfies the preparing number of components (2,000) without exceeding the limit accommodation number (3,000 components). In this case, reel 13 (E2) with the older loading date of "2016 Dec. 11" than reel 13 (E3) with the loading date of "2016 Dec. 22" is prioritized and selected. In other words, storage instructing unit 51c instructs that reel 13 (E2) (component accommodating body) with older loading date (loading date and time) is prioritized and is integrated with reel 13 (E4) (component accommodating body) to be stored in component accommodating body storeroom 7 henceforth (refer to FIG. 13).

In a case of component D such as a hygroscopic component with a set expiration date, storage instructing unit 51c instructs that reel 13 (component accommodating body) that accommodates component D with a short expiration date is prioritized and is integrated with a component accommodating body to be stored henceforth. In addition, storage instructing unit 51c may instruct that reel 13 with the small accommodating number of components is prioritized and is integrated. In this case, storage instructing unit 51c instructs that reel 13 (E4) to be stored henceforth is integrated with reel 13 (E3) with the accommodating number of components of 900 smaller than reel 13 (E2) with the accommodating number of components of 1,000. In addition, storage instructing unit 51c may select reel 13 with the small accommodating number of components after the integration in a combination by which the accommodating number of components after the integration satisfies the preparing number of components.

In FIG. 13, reel 13 (F1) with the reel ID of F1 has the accommodating number of components of 2,500 and has components D exceeding the preparing number of components of 1,000 of the component type of "FFFF" included in preparation component information Ie (refer to FIG. 12). Storage instructing unit 51c instructs that the splitting process is performed to split the components D accommodated in the component accommodating body (reel 13 (F1)) to be stored henceforth into a plurality of component accommodating bodies (child reel 13 (F1) and parent reel 13 (F2)).

In FIG. 8, preparation instructing unit 51d generates a preparation instruction of a component accommodating body (reel 13 or tray 14) that is taken (unloaded) out of component accommodating body storeroom 7. The preparation instruction is based on the component type and the preparing number of components D to be prepared, which are included in preparation component information Ie, and the component type and the accommodating number of components D that are stored, which are included in storage component information Isb. Preparation instructing unit 51d stores the preparation instruction as preparation instruction information Pea in management storage 52. In addition, preparation instructing unit 51d transmits the generated preparation instruction to component accommodating body storeroom 7 and portable terminal 9 via communicator 55.

Here, an example of preparation instruction information Pea (Peb or Pec) is described with reference to FIG. 14. FIG. 14 is a diagram illustrating a configuration of an example of preparation instruction information Pea (Peb or Pec) that is used in component mounting system 1 of the exemplary embodiment. In this example, preparation instruction information Pea includes reel ID in "reel ID" column 121, the component type of components D in "component type" column 122, the accommodating number of components D that are housed in reel 13 in "accommodating number of components" column 123, and reel ID of parent reel 13 that is subjected to the integration process in "integration reel" column 124. Further, preparation instruction information Pea includes reel ID of child reel 13 that is subjected to the splitting process in "splitting reel" column 125, a parent-child relationship in the integration process or the splitting process in "relationship" column 126, the component using position of components D to be prepared, in "using position" column 127, and the predicted date on which component D is required, in "preparation predicted date" column 128.

In FIG. 14, in this example, preparation instruction with respect to reels 13 with reel ID of A4 (A5) and B3 (B1), which are to be unloaded from component accommodating body storeroom 7 henceforth, is included. The preparing number of components D with the component type of "AAAA" included in preparation component information Ie (refer to FIG. 12) is 1,800. On the other hand, reels 13 with reel ID of A3, A4, A5, and A6 which accommodate components D with the component type of "AAAA" which are stored in component accommodating body storeroom 7, which is included in storage component information Isb (refer to FIG. 11), have the accommodating number of components of 1,600, 1,500, 400, and 500, respectively, and one reel 13 does not satisfy the preparing number of components of 1,800.

Preparation instructing unit 51d instructs component accommodating body storeroom 7 that reel 13 (component accommodating body) having the accommodating number of components satisfying the preparing number of components is prepared. More specifically, in a case where it is not possible to satisfy the preparing number of components by one reel 13, preparation instructing unit 51d instructs to prepare a plurality of reels 13. Preparation instructing unit 51d instructs component accommodating body storeroom 7 having a function of performing the integration process of integrating a plurality of components D accommodated in a plurality of reels 13 with one reel 13 that the integration process is performed on the plurality or reels 13 of which a total of the accommodating numbers of components satisfies the preparing number of components.

In FIG. 11, when reel 13 (A3) and reel 13 (A4) are integrated with each other, the total of the accommodating number of components is 3,100 and exceeds the limit accommodation number (3,000 components), and thus preparation instructing unit 51d does not select this combination. Preparation instructing unit 51d instructs that reel 13 (component accommodating body) having the small accommodating number of components is prioritized and a plurality of component accommodating bodies are prepared. In this case, preparation instructing unit 51d instructs that reel 13 (A5) having the small accommodating number of components of 400 and reel 13 (A4) having the accommodating number of components of 1,500 are subjected to the integration process (refer to FIG. 14).

Preparation instructing unit 51d may instruct that reel 13 with older loading date (loading date and time) is prioritized and prepared, of a plurality of reels 13 (component accommodating bodies) that are stored in component accommodating body storeroom 7. In this case, preparation instructing unit 51d instructs that reel 13 (A6) with the old loading date of "2016 Oct. 24" and reel 13 (A4) with the loading date of "2016 Dec. 18" are subjected to the integration process. In a case of component D such as a hygroscopic component with a set expiration date, preparation instructing unit 51d instructs that reel 13 accommodating component D with the shortest expiration date is prioritized and is prepared, of a plurality of reels 13 (component accommodating bodies) that are stored in component accommodating body storeroom 7.

In FIG. 11, reel 13 (B1) with the reel ID of B1 has the accommodating number of components of 2,500, reel 13 (B2) with the reel ID of B2 has the accommodating number of components of 3,000, and components D exceeding the preparing number of components of 500 with the component type of "BBBB", which are included in preparation component information Ie (refer to FIG. 12) are accommodated. In a case where there are a plurality of reels 13 (component accommodating bodies) (reel 13 (B1) and reel 13 (B2)) accommodating components D exceeding the preparing number of components, preparation instructing unit 51d instructs that reel 13 (B1) (component accommodating body) having the small accommodating number of components is prioritized and subjected to the splitting process.

In other words, preparation instructing unit 51d instructs that components D accommodated in reel 13 (B1) are subjected to the splitting process and are split into parent reel 13 (B3) having the accommodating number of components D of 500 and child reel 13 (B1) having the accommodating number of components of 2,000 (refer to FIG. 14).

As described above, in a case where the number of components D accommodated in one reel 13 (B1) (component accommodating body) exceeds the preparing number of components (500), component accommodating body storeroom 7 has a function of performing the splitting process of splitting a plurality of components D accommodated in one reel 13 (B1) into a plurality of reels 13 (parent reel 13 (B3) and child reel 13 (B1)). Preparation instructing unit 51d instructs component accommodating body storeroom 7 that the splitting process is performed to split reel 13 (B1) (corresponding component accommodating body) such that the accommodating number of components in at least one reel 13 (B3) satisfies the preparing number of components. In a case where a plurality of reels 13 (component accommodating bodies) accommodating the number of components D exceeding the preparing number of components, preparation instructing unit 51d may instruct that reel 13 with older loading date (loading date and time) is prioritized and is subjected to the splitting process, of the plurality of reels 13. In this case, preparation instructing unit 51d instructs that reel 13 (B2) with the older loading date of "2016 Nov. 19" than reel 13 (B1) with the loading date of "2017 Jan. 9" is prioritized and is subjected to the splitting process.

Reel 13 (component accommodating body) that is to be stored henceforth or that is prepared to be unloaded henceforth is determined, based on a model of a tape feeder (component supply device) that is installed in mounters M2 and M3 included in line configuration information IIb or that is scheduled to be installed henceforth. In a case where the model of the component supply device that supplies component D does not accept carrier tape TP subjected to the splicing process in reels 13 (component accommodating bodies), storage instructing unit 51c and preparation instructing unit 51d instruct that reel 13 (component accommodating body) is stored or unloaded as it is. The integration prohibition (prohibition of the splicing process) may be set to storage component information Isa (Isb) or identifying code C of reel 13 (component accommodating body).

In addition, the limit accommodation number of reel 13 (component accommodating body) depends on the component type (size) of components D and the size of reel 13 and is not limited to 3,000 components. Even in a case where the accommodating number of components after the integration exceeds the limit accommodation number, storage instructing unit 51c and preparation instructing unit 51d may instruct that large-sized reel 13 is transferred when the integration process is instructed, in a case where carrier tape TP obtained after the integration is transferred to large-sized reel 13.

In FIG. 8, component accommodating body storeroom 7 includes storeroom controller 61, storeroom storage 62, code reader 15b, touch panel 16, integration processor 18, splitting processor 19, transporter 21, and communicator 63. Communicator 63 is a communication interface and transmits and receives a signal or information to and from management computers 2 via communication network 6. Storeroom controller 61 is a calculation device having a function of a CPU and includes internal processors such as instruction acquirer 61a, storage component identifier 61b, and transport controller 61c.

Storeroom storage 62 is a storage device and stores storage component information Isa, storage instruction information Psb and preparation instruction information Peb, and the like. Storage component information Isa includes the component type and the accommodating number of components D that are accommodated in the component accommodating body (reel 13 or tray 14) which is stored in component accommodating body storeroom 7 (refer to FIG. 11). In other words, storeroom storage 62 stores the component type and the accommodating number of components D which are accommodated in the stored component accommodating body.

In FIG. 8, instruction acquirer 61a acquires storage instruction information Psa and preparation instruction information Pea from management computer 2 and stores the information as storage instruction information Psb (refer to FIG. 13) and preparation instruction information Peb (refer to FIG. 14) to storeroom storage 62. In other words, instruction acquirer 61a is the storage instruction acquirer that acquires storage instruction (storage instruction information Psa) including the component type and the preparing number of components D to be prepared. In addition, instruction acquirer 61a is the preparation instruction acquirer that acquires preparation instruction (preparation instruction information Pea) including the component type and the preparing number of components D to be prepared.

Storage component identifier 61b identifies the component type and the accommodating number of components D that are accommodated in the component accommodating body to be stored henceforth, based on storage instruction information Psb including information recorded in identifying code C adhered to the component accommodating body (reel 13 or tray 14) recognized by code reader 15b. In a case where storage instruction information Psb includes information recorded of the recognized component accommodating body, storage component identifier 61b acquires information from database (not illustrated) that is connected to management computer 2 or communication network 6.

In FIG. 8, transport controller 61c is a controller that controls transporter 21, based on the storage instruction included in storage instruction information Psb and preparation instruction included in preparation instruction information Peb. In a case where the component accommodating body (reel 13 or tray 14) is loaded, transport controller 61c controls transporter 21 so as for the component accommodating body to be transported from hatch 15a such that the accommodating number of components of the component accommodating body to be stored henceforth satisfies the preparing number of components based on the storage instruction. More specifically, component accommodating body storeroom 7 includes integration processor 18 and transport controller 61c controls transporter 21 such that the component accommodating body is transported to integration processor 18 based on the storage instruction in a case where the number of components in the component accommodating bodies to be stored henceforth is not possible to satisfy the preparing number of components.

In addition, even in a case where component accommodating body storeroom 7 includes integration processor 18, transport controller 61c controls transporter 21 such that the component accommodating body is transported to integration processor 18 based on the storage instruction in a case where the total of the accommodating number of components of the component accommodating body to be stored henceforth and the accommodating number of components of another component accommodating body exceeds the limit accommodation number, in a case where integration prohibition is set to the component accommodating body which is a target of the integration process, or in a case where the model of component supply device that supplies component D by the component accommodating body to be stored henceforth does not accept spliced carrier tape TP.

In addition, transport controller 61c may perform control by prioritizing the component accommodating body with old loading date and time or prioritizing the component accommodating body accommodating component D with a short expiration date, based on the storage instruction. Transport controller 61c controls transporter 21 such that the component accommodating body is transported to integration processor 18, in order to integrate the component accommodating body to the component accommodating body to be stored henceforth. In addition, in a case component accommodating body storeroom 7 includes splitting processor 19 and components D exceeding the preparing number of components are accommodated in the component accommodating body to be stored henceforth, transport controller 61c controls transporter 21 such that the component accommodating body is transported to splitting processor 19, based on the storage instruction. In addition, transport controller 61c controls transporter 21 such that the component accommodating body having the small accommodating number of components is prioritized and transported to integration processor 18 or splitting processor 19, based on the storage instruction.

In FIG. 8, in a case where the component accommodating body (reel 13 or tray 14) is unloaded, transport controller 61c controls transporter 21 such that the component accommodating body having the accommodating number of components satisfying the preparing number of components is transported to hatch 15a, based on the preparation instruction. More specifically, in a case where one component accommodating body does not have the number of components satisfying the preparing number of components, transport controller 61c controls transporter 21 such that a plurality of component accommodating bodies are transported to hatch 15a, based on the preparation instruction. In addition, in a case where component accommodating body storeroom 7 includes integration processor 18, transport controller 61c controls transporter 21 such that the plurality of component accommodating bodies having the total of the accommodating numbers of components which satisfies the preparing number of components are transported to integration processor 18, based on the preparation instruction.

In addition, in a case component accommodating body storeroom 7 includes splitting processor 19 and one component accommodating body accommodates the number of components D exceeding the preparing number of components, transport controller 61c controls transporter 21 such that the component accommodating body is transported to splitting processor 19, based on the preparation instruction. In addition, transport controller 61c controls transporter 21 such that the component accommodating body with old loading date and time or the component accommodating body accommodating components D with a short expiration date is prioritized, of the plurality of component accommodating bodies, and is transported to integration processor 18 or splitting processor 19, based on the preparation instruction. In addition, transport controller 61c controls transporter 21 such that the component accommodating body having the small accommodating number of components is prioritized and transported to integration processor 18 or splitting processor 19, based on the preparation instruction.

In FIG. 8, integration processor 18 performs the integration process of integrating a plurality of transported component accommodating bodies, based on the storage instruction or the preparation instruction. Splitting processor 19 performs the splitting process of splitting the transported component accommodating body, based on the storage instruction or the preparation instruction.

Component accommodating body storeroom 7 may include preparation component extractor 51b included in management computer 2. The component type and the preparing number of components D to be prepared, may be extracted from at least any one of production planning information Ipa (Ipb) and mounter component information Ima (Imb). Here, production planning information Ipa (Ipb) includes the component type of components that are mounted on the mounting board and the production number of mounting boards produced by mounter M2 and M3. Mounter component information Ima (Imb) includes the component type and the remaining number of components D accommodated in the component accommodating body that accommodates components D which are supplied from the component supply device included in mounter M2 or M3. In this case, transport controller 61c controls transporter 21, based on the extracted component type and extracted preparing number of components.

Next, a configuration of a control system of portable terminal 9 will be described with reference to FIG. 9. FIG. 9 is a block diagram illustrating the configuration of the control system of portable terminal 9 that is used in component mounting system 1 of the exemplary embodiment. Portable terminal 9 includes terminal controller 71, terminal storage 72, terminal-side communicator 10, touch panel 11, and code reader 12. Terminal-side communicator 10 transmits and receives information to and from management computer 2 in wireless communication. Terminal controller 71 is a calculation device having a function of a CPU and includes an internal processor such as instruction acquirer 71a or display processor 71b. Terminal storage 72 is a storage device and stores storage instruction information Psc and preparation instruction information Pec. Instruction acquirer 71a acquires storage instruction information Psa (refer to FIG. 13) and preparation instruction information Pea (refer to FIG. 14) from management computer 2 and stores the information as storage instruction information Psc and preparation instruction information Pec to terminal storage 72.

Display processor 71b generates a screen display and displays the screen display on touch panel 11 for an operator to load and unload the component accommodating body to and from component accommodating body storeroom 7, based on storage instruction information Psc, preparation instruction information Pec, and information of component accommodating body (reel 13 or tray 14) recognized by code reader 12. For example, in a case of a loading process, display processor 71b displays information for identifying the component accommodating body inserted into hatch 15a of component accommodating body storeroom 7, the component accommodating body transported by the operator, in a work order. In addition, in a case of an unloading process, display processor 71b displays information for identifying the component accommodating body that is taken out from hatch 15a of component accommodating body storeroom 7 by the operator, and the component using position at which the component accommodating body is used in the work order.

Figure 15:
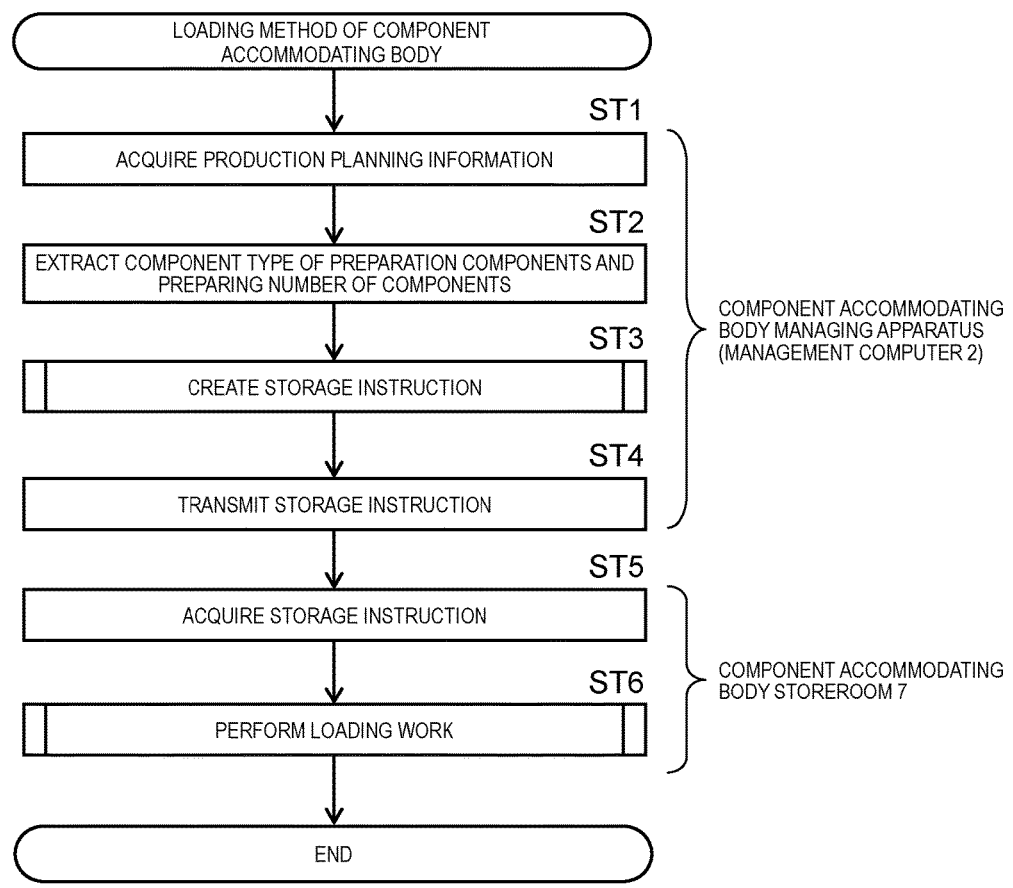
FIG. 15 is a flowchart of a loading method of a component accommodating body in the component mounting system of the exemplary embodiment.
Figure 16:
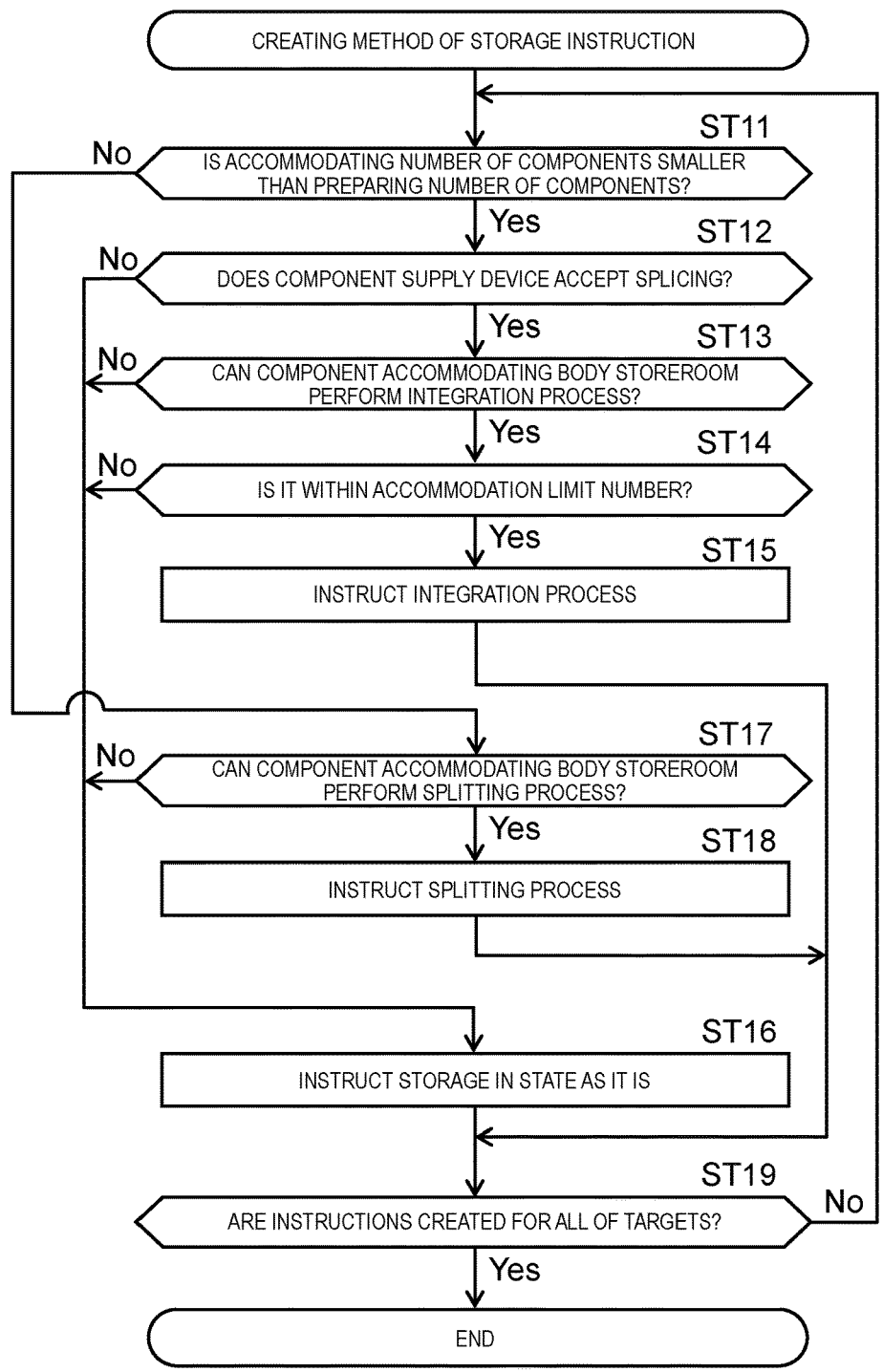
FIG. 16 is a flowchart of a generating method of a storage instruction in a management computer of the exemplary embodiment.
Figure 17:
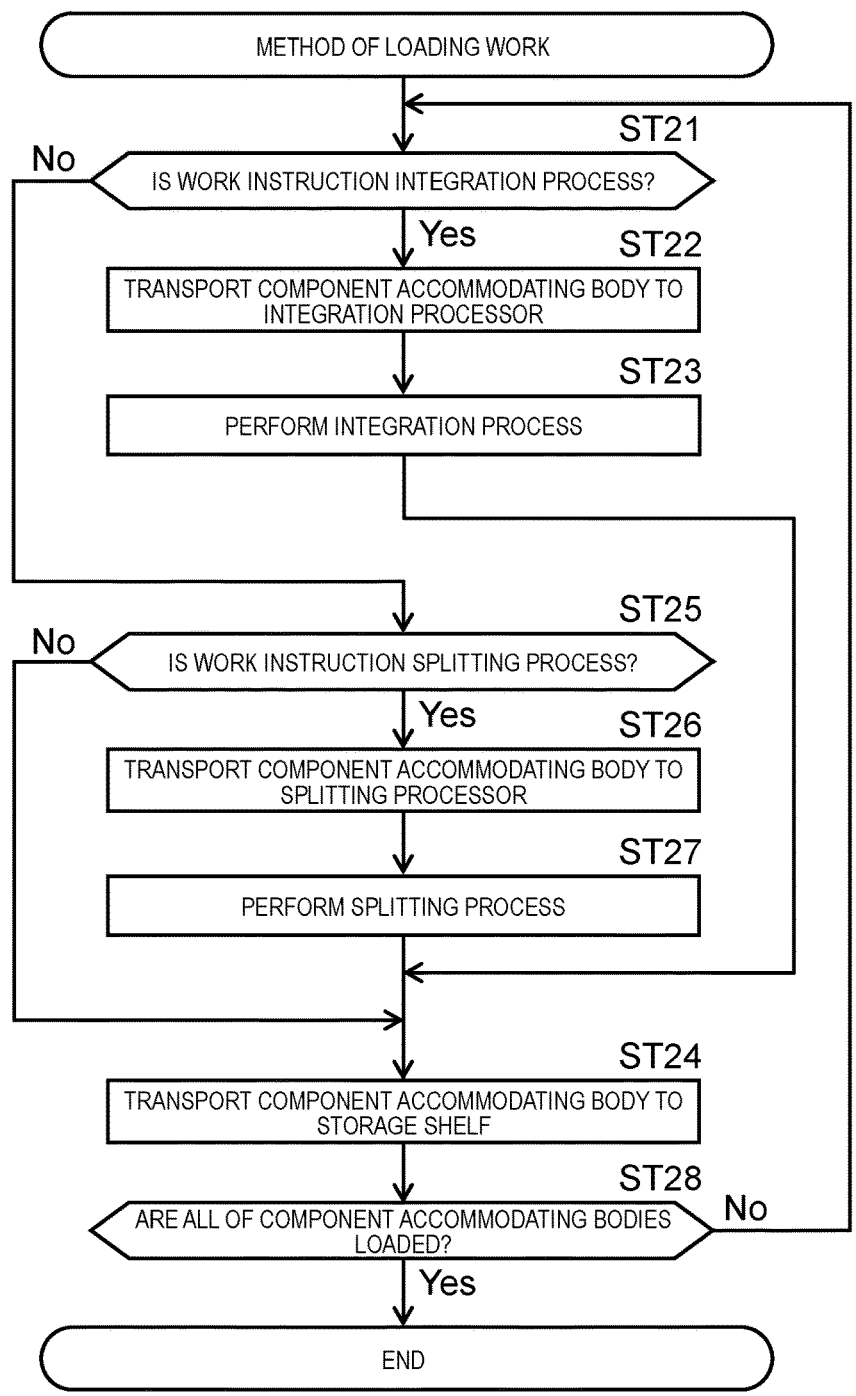
FIG. 17 is a flowchart of a loading work method in the component accommodating body storeroom of the exemplary embodiment.

Next, according to flowcharts in FIGS. 15 to 17, a loading method (component storage instructing method) of the component accommodating body by management computer 2 (component accommodating body managing apparatus) and component accommodating body storeroom 7. FIG. 15 is a flowchart of the loading method of component accommodating body 1 in component mounting system 1 of the exemplary embodiment. In FIG. 15, management computer 2 acquires production planning information Ipa (Ipb) by information acquirer 51a (ST1), and preparation component extractor 51b extracts the component type and the preparing number of components to be prepared (ST2: first preparation component extracting step). Management computer 2 generates the storage instruction (storage instruction information Psa) by storage instructing unit 51c (ST3: storage instructing step), and the instruction is transmitted to predetermined component accommodating body storeroom 7 (ST4). Subsequently, component accommodating body storeroom 7 acquires the storage instruction (storage instruction information Psa (Psb)) by instruction acquirer 61a (ST5) and the loading work is performed (ST6).

Subsequently, a method of generating storage instruction (ST3) by management computer 2 (component accommodating body managing apparatus) will be described with reference to FIG. 16. FIG. 16 is a flowchart of a method of generating the storage instruction in management computer 2 of the exemplary embodiment. In a case where the accommodating number of components accommodated in the component accommodating body to be stored henceforth is smaller than the preparing number of components (Yes in ST11), the component supply position corresponds to carrier tape TP subjected to splicing process by the component supply device (Yes in ST12), and component accommodating body storeroom 7 includes integration processor 18 (Yes in ST13), management computer 2 determines whether or not the accommodating number of components after the integration process is within the limit accommodation number (ST14).

In a case where the accommodating number of components after the integration process is within the limit accommodation number (Yes in ST14), management computer 2 generates the storage instruction such that the integration process is performed (ST15). In a case where the component supply device does not accept carrier tape TP subjected to the splicing process (No in ST12), component accommodating body storeroom 7 includes integration processor 18 (No in ST13), or the accommodating number of components after the integrating process exceeds the limit accommodation number (No in ST14), management computer 2 generates the storage instruction such that the component accommodating body is stored as it is (ST16).

In FIG. 16, in a case where the accommodating number of components of the component accommodating body to be stored henceforth is equal to or larger than the preparing number of components (No in ST11), management computer 2 determines whether or not component accommodating body storeroom 7 includes splitting processor 19 (ST17). In a case where component accommodating body storeroom 7 includes splitting processor 19 (Yes in ST17), management computer 2 generates the storage instruction such that the splitting process is performed (ST18). In a case where component accommodating body storeroom 7 does not include splitting processor 19 (No in ST17), management computer 2 generates the storage instruction such that the component accommodating body is stored as it is (ST16).

Management computer 2 generates the storage instruction such that component D, from which preparation component extractor 51b does not extract information, is stored as it is. In addition, in this case, management computer 2 may determine that component D is not used in a short period, and component accommodating body storeroom 7 and may generate the storage instruction such that the component is stored on a storage shelf other than component accommodating body storeroom 7. The component is instructed to be stored on storage shelf other than component accommodating body storeroom 7, and thereby it is possible to secure space in component accommodating body storeroom 7.

Until the generation of the storage instruction of all of the component accommodating bodies to be stored henceforth is ended, (No in ST19), management computer 2 repeatedly executes ST11 to ST18 described above and generates the storage instruction (ST15, ST16, and ST18).

Next, a method of loading work (ST6) in component accommodating body storeroom 7 will be described with reference to FIG. 17. FIG. 17 is a flowchart of a method of loading work in component accommodating body storeroom 7 of the exemplary embodiment. In a case where the storage instruction is the integration process (Yes in ST21), component accommodating body storeroom 7 transports the component accommodating body from hatch 15a to integration processor 18 (ST22), the integration process is performed (ST23), and the component accommodating body is transported to storage shelf 17 (ST24) after the integration process. In a case where the storage instruction is not the integration process (No in ST21) but the splitting process (Yes in ST25), component accommodating body storeroom 7 transports the component accommodating body from hatch 15a to splitting processor 19 (ST26), the splitting process is performed (ST27), and the component accommodating body is transported to storage shelf 17 (ST24) after the splitting process.

In a case where the storage instruction is neither the integration process nor the splitting process (No in ST25), component accommodating body storeroom 7 transports the component accommodating body from hatch 15a to storage shelf 17 as it is (ST24). Until all of the component accommodating bodies are loaded (No in ST28), component accommodating body storeroom 7 repeatedly executes ST21 to ST27 described above and transports the component accommodating body to storage shelf 17 (ST24).

Figure 18:
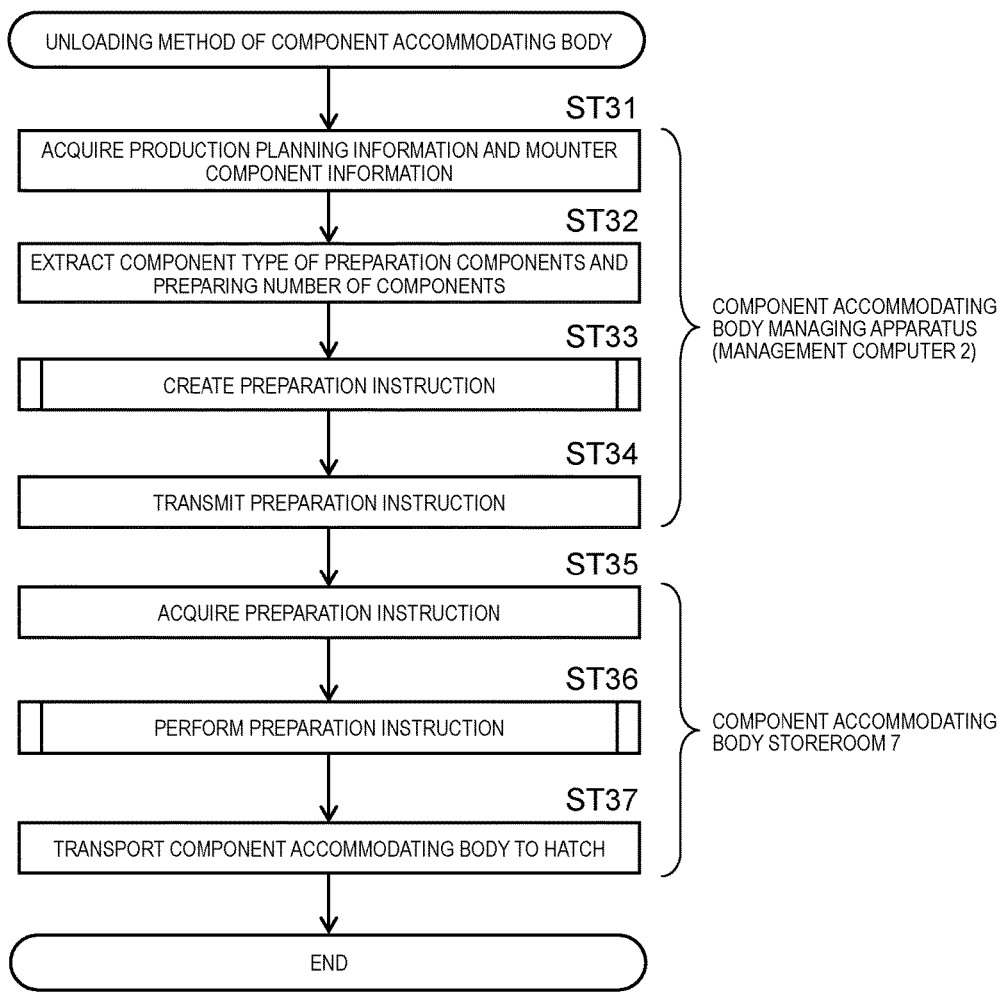
FIG. 18 is a flowchart of an unloading method of a component accommodating body in the component mounting system of the exemplary embodiment.
Figure 19:
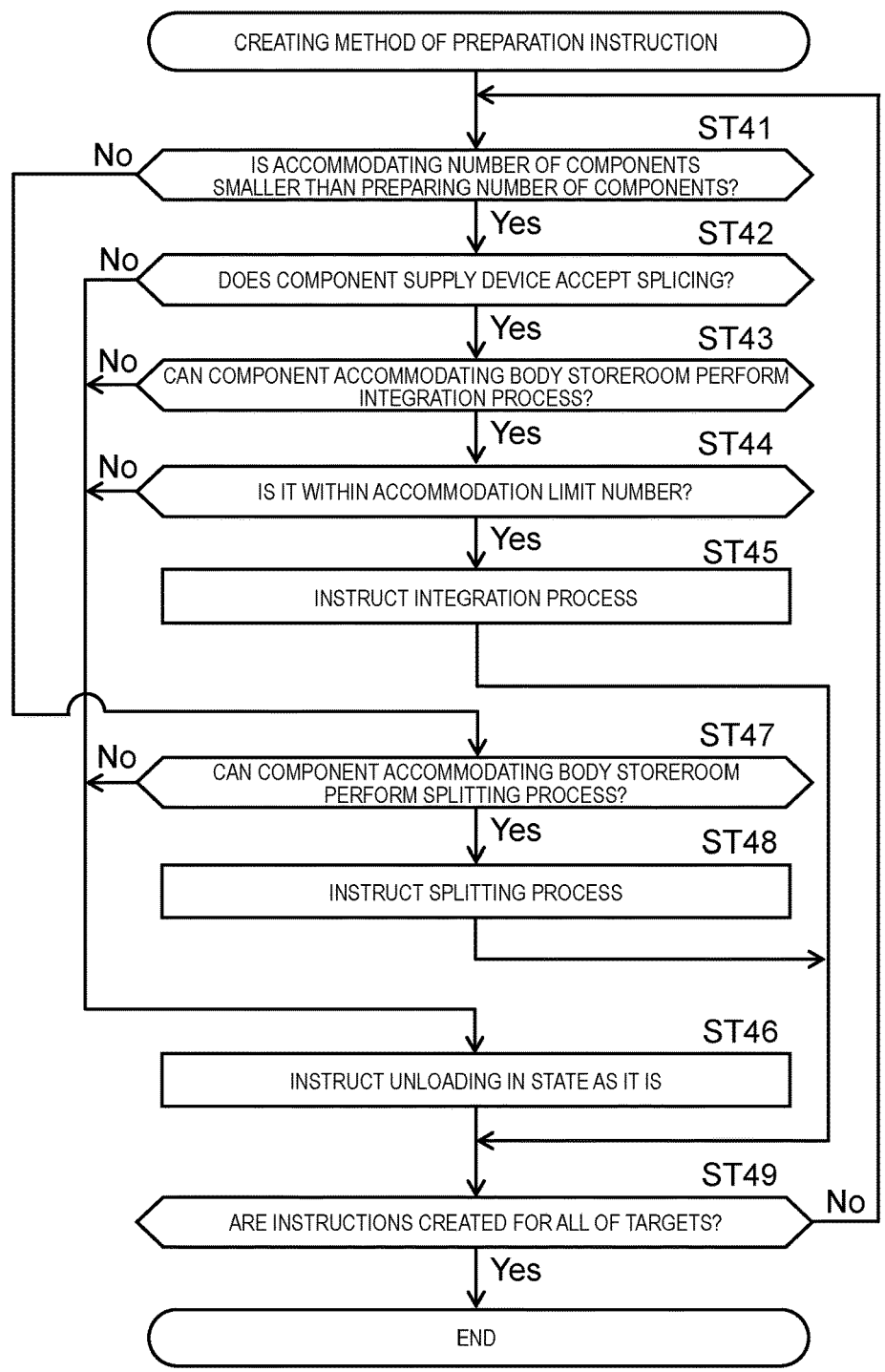
FIG. 19 is a flowchart of a generating method of a storage instruction in another management computer of the exemplary embodiment.
Figure 20:
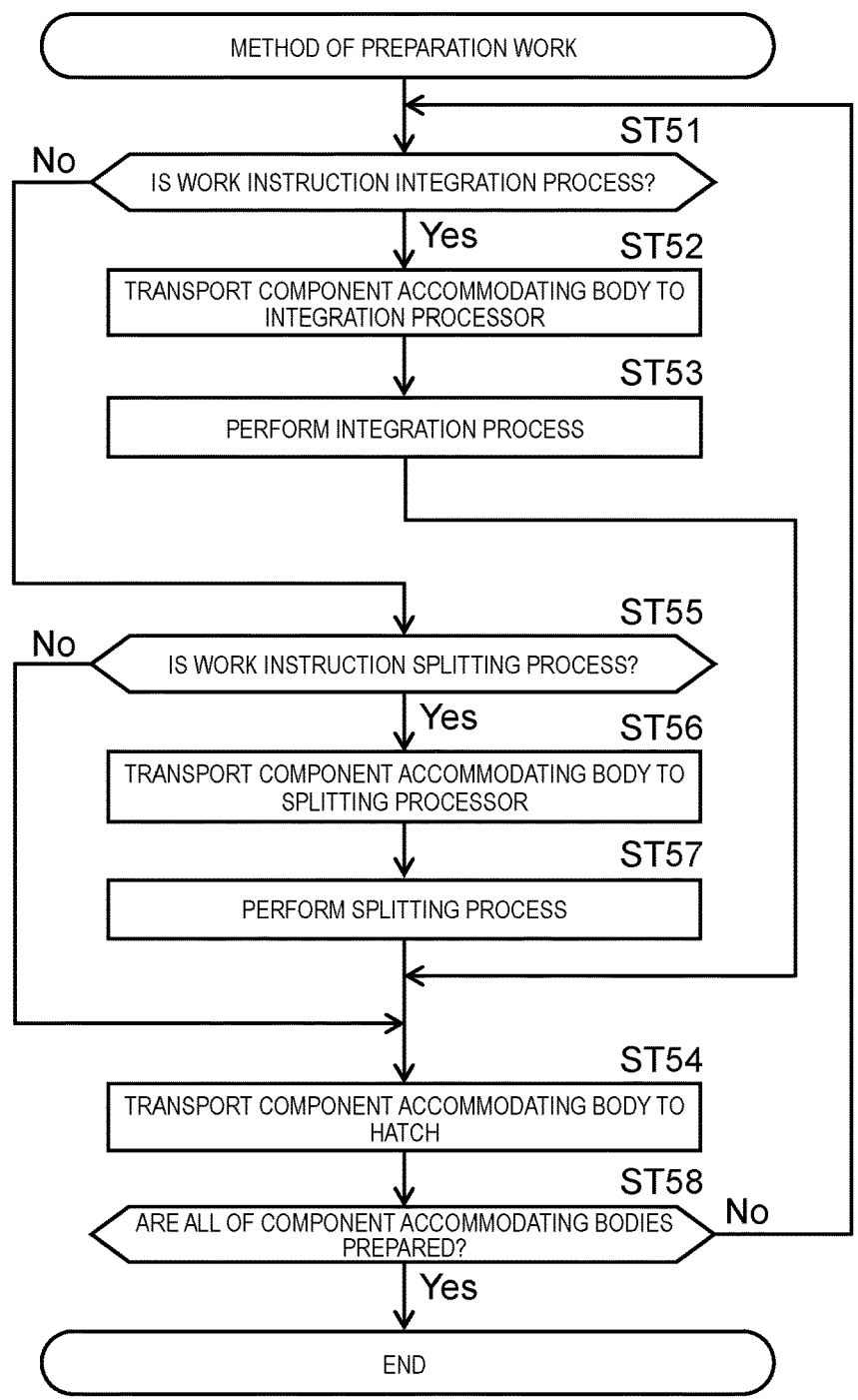
FIG. 20 is a flowchart of a preparation work method in the component accommodating body storeroom of the exemplary embodiment.

Next, according to flowcharts in FIGS. 18 to 20, an unloading method (component preparation instructing method) of the component accommodating body by management computer 2 (component accommodating body managing apparatus) and component accommodating body storeroom 7. FIG. 18 is a flowchart of the unloading method of the component accommodating body in component mounting system 1 of the exemplary embodiment. In FIG.

18, management computer 2 acquires production planning information Ipa (Ipb) and mounter component information Ima (Imb) by information acquirer 51a (ST31), and preparation component extractor 51b extracts the component type and the preparing number of components to be prepared (ST32: second preparation component extracting step). Management computer 2 generates the preparation instruction (preparation instruction information Pea) by preparation instructing unit 51d (ST33: preparation instructing step), and the instruction is transmitted to predetermined component accommodating body storeroom 7 (ST34). Subsequently, component accommodating body storeroom 7 acquires the preparation instruction (preparation instruction information Pea (Peb)) by instruction acquirer 61a (ST35), performs preparation work (ST36), and the component accommodating body is transported to hatch 15a after the preparation work (ST37).

Next, a method of preparation instruction (ST33) by management computer 2 (component accommodating body managing apparatus) will be described with reference to FIG. 19. FIG. 19 is a flowchart of a generating method of a preparation instruction in management computer 2 of the exemplary embodiment. In a case where the accommodating number of components accommodated in the component accommodating body to be unloaded henceforth is smaller than the preparing number of components (Yes in ST41), the component supply device corresponds to carrier tape TP subjected to splicing process by the component supply device (Yes in ST42), and component accommodating body storeroom 7 includes integration processor 18 (Yes in ST43), management computer 2 determines whether or not the accommodating number of components after the integration process is within the limit accommodation number (ST44).

In a case where the accommodating number of components after the integration process is within the limit accommodation number (Yes in ST44), management computer 2 generates the preparation instruction such that the integration process is performed (ST45). In a case where the component supply device does not accept carrier tape TP subjected to the splicing process (No in ST42), component accommodating body storeroom 7 includes integration processor 18 (No in ST43), or the accommodating number of components after the integrating process exceeds the limit accommodation number (No in ST44), management computer 2 generates the preparation instruction such that the component accommodating body is stored as it is (ST46).

In FIG. 19, in a case where the accommodating number of components of the component accommodating body to be stored henceforth is equal to or larger than the preparing number of components (No in ST41), management computer 2 determines whether or not component accommodating body storeroom 7 includes splitting processor 19 (ST47). In a case where component accommodating body storeroom 7 includes splitting processor 19 (Yes in ST47), management computer 2 generates the preparation instruction such that the splitting process is performed (ST48). In a case where component accommodating body storeroom 7 does not include splitting processor 19 (No in ST47), management computer 2 generates the preparation instruction such that the component accommodating body is stored as it is (ST46).

Until the generation of the preparation instruction of all of the component accommodating bodies to be stored henceforth is ended, (No in ST49), management computer 2 repeatedly executes ST41 to ST48 described above and generates the preparation instruction (ST45, ST46, and ST48).

Next, a method of preparation work (ST36) before unloading component accommodating body storeroom 7 will be described with reference to FIG. 20. FIG. 20 is a flowchart of the method of preparation work in component accommodating body storeroom 7 of the exemplary embodiment. In a case where the preparation instruction is the integration process (Yes in ST51), component accommodating body storeroom 7 transports the component accommodating body from storage shelf 17 to integration processor 18 (ST52), the integration process is performed (ST53), and the component accommodating body is transported to hatch 15a (ST54) after the integration process. In a case where the preparation instruction is not the integration process (No in ST51) but the splitting process (Yes in ST55), component accommodating body storeroom 7 transports the component accommodating body from storage shelf 17 to splitting processor 19 (ST56), the splitting process is performed (ST57), and the component accommodating body is transported to hatch 15a after the splitting process (ST54).

In a case where the preparation instruction is neither the integration process nor the splitting process (No in ST55), component accommodating body storeroom 7 transports the component accommodating body from storage shelf 17 to hatch 15a as it is (ST54). Until preparation of all of the component accommodating bodies before unloading is ended (No in ST58), component accommodating body storeroom 7 repeatedly executes ST51 to ST57 described above and transports the component accommodating body to the hatch 15 (ST54).

As described above, management computer 2 (component accommodating body managing apparatus) includes preparation component extractor 51b, management storage 52, and storage instructing unit 51c.

Preparation component extractor 51b extracts the component type and the preparing number of components to be prepared, from production planning information Ipb including the component type of components D that is mounted on a mounting board and the production number of mounting boards.

Management storage 52 stores the component type and the accommodating number of components D that are accommodated in the component accommodating body (reel 13 or tray 14) which is stored in component accommodating body storeroom 7 and that are accommodated in the component accommodating body to be stored henceforth.

Storage instructing unit 51e generates the storage instruction of the component accommodating body that is stored in component accommodating body storeroom 7 such that the accommodating number of components that are to be stored henceforth satisfies the preparing number of components, based on the extracted preparing number of components and the extracted accommodating number of components stored.

In addition, component accommodating body storeroom 7 of the exemplary embodiment includes a storage instruction acquirer (instruction acquirer 61a), storeroom storage 62, transporter 21, and controller (transport controller 61e).

Storage instruction acquirer (instruction acquirer 61a) acquires storage instruction (storage instruction information Psa (Psb)) including the component type and the preparing number of components D to be prepared.

Storeroom storage 62 stores the component type and the accommodating number of components D which are accommodated in the stored component accommodating body.

Transporter 21 transports the component accommodating body to be loaded and unloaded through hatch 15a and transported to the inside from hatch 15a.

The controller (transport controller 61c) controls transporter 21 so as for the component accommodating body to be transported from hatch 15a such that the accommodating number of components of the component accommodating body to be stored henceforth satisfies the preparing number of components based on the storage instruction.

In this manner, the component accommodating body (reel 13 or tray 14) accommodating the plurality of components D can be managed to be loaded in component accommodating body storeroom 7 in an appropriate state so as to be used in production.

As described above, description is provided based on one embodiment of this disclosure. Various modification examples can be made from the embodiment by combining the constituent elements or processes, and thus those skilled in the art understand that the modification examples are also included within the scope of this disclosure.

In the above description, the component accommodating body managing apparatus (management computer 2) is described as an example in which the component accommodating body managing apparatus instructs component accommodating body storeroom 7 to store component D. However, the component accommodating body managing apparatus may instruct not only component accommodating body storeroom 7 but also portable terminal 9 that is carried by an operator to store component D. In a case where the component accommodating body managing apparatus instructs portable terminal 9 to store component D, the operator stores component D by following storage instruction displayed on touch panel 11 of portable terminal 9. Therefore, an operator with little work experience is also able to easily perform the work and workability improves.

According to this disclosure, the plurality of component accommodating bodies accommodating the plurality of components can be managed to be used in production in appropriate states.

The component accommodating body managing apparatus, the component accommodating body storeroom, and the component storage instructing method are effective in that the plurality of component accommodating bodies accommodating the plurality of components can be managed to be used in production in appropriate states, and are applicable to the component mounting field in which a component is mounted on a board.

What is claimed is:

1. A component accommodating body managing apparatus comprising:
    a preparation component extractor that extracts a component type and a preparing number of components to be prepared from production planning information, wherein the production planning information includes a component type of a component that is to be mounted on a mounting board and the production number of the mounting board;
    a management storage that stores a component type and an accommodating number of components, wherein the accommodating number of components is the number of components accommodated in a component accommodating body that is stored in a component accommodating body storeroom; and
    a storage instructing unit that generates and transmits storage instruction of the component accommodating body that is to be stored in the component accommodating body storeroom, based on the preparing number of components extracted by the preparation component extractor, and the accommodating number of components stored in the management storage,
    wherein the storage instructing unit instructs the component accommodating body storeroom such that the accommodating number of components satisfies the preparing number of components by having the accommodating number of components equal to or more than the preparing number of components.

2. The component accommodating body managing apparatus of claim 1,
    wherein the component accommodating body storeroom has a function of performing an integration process of integrating a plurality of components accommodated in a plurality of component accommodating bodies into one component accommodating body, and
    wherein the storage instructing unit instructs the component accommodating body storeroom to perform the integration process when the component accommodating body does not have the number of components to satisfy the preparing number of components.

3. The component accommodating body managing apparatus of claim 2,
    wherein the storage instructing unit instructs the one component accommodating body to be stored as is:
        when the accommodating number of components after the integration process would exceed a limit accommodation number, or
        when integration is prohibited.

4. The component accommodating body managing apparatus of claim 2,
    wherein the one component accommodating body is one of a plurality of reel that holds a carrier tape housing the component in a wound state,
    and
    wherein the integration process is a splicing process of joining the carrier tapes held by the plurality of reels.

5. The component accommodating body managing apparatus of claim 4,
    wherein the management storage further stores a model of component supply device that supplies the component accommodated in the component accommodating body to a mounter, and
    wherein the storage instructing unit instructs that the one component accommodating body be stored as it is when the model of component supply device that supplies the component does not accept a carrier tape subjected to the splicing process.

6. The component accommodating body managing apparatus of claim 2,
    wherein the storage instructing unit instructs the component accommodating body storeroom that a component accommodating body with an older component loading date and time is prioritized, of the plurality of component accommodating bodies, and is integrated with the one component accommodating body that is to be stored in the component accommodating body storeroom.

7. The component accommodating body managing apparatus of claim 2,
    wherein the storage instructing unit instructs the component accommodating body storeroom that a component accommodating body that accommodates a component with a short expiration date is prioritized, of the plurality of component accommodating bodies, and is integrated with the one component accommodating body that is to be stored in the component accommodating body storeroom henceforth.

8. A component accommodating body storeroom that stores a plurality of component accommodating bodies which accommodate components supplied from a component supply device installed in a mounter, the storeroom comprising:
- a storage instruction acquirer that acquires storage instruction including a component type of a component to be prepared and a preparing number of components;
- a storeroom storage that stores a component type and an accommodating number of components which are accommodated in the stored component accommodating body;
- a hatch through which the component accommodating body is loaded in and unloaded from the storeroom;
- a transporter that transports the component accommodating body to an inside of the component accommodating body storeroom from the hatch; and
- a controller that controls the transporter based on the storage instruction,
- wherein the controller controls the transporter to have the accommodating number of components satisfy the preparing number of components by having the accommodating number of components equal to or more than the preparing number of components.

9. The component accommodating body storeroom of claim 8, further comprising:
- an integration processor performs an integration process that integrates a plurality of components accommodated in the plurality of component accommodating bodies into one component accommodating body,
- wherein the controller controls the transporter such that the component accommodating body is transported to the integration processor when the component accommodating body that is to be stored in the component accommodating body storeroom henceforth does not have the number of components to satisfy the preparing number of components, and
- wherein the integration processor integrates the transported component accommodating body and another component accommodating body into the one component accommodating body.

10. The component accommodating body storeroom of claim 9,
- wherein the controller controls the transporter such that the component accommodating body is not transported to the integration processor:
  - when a total number of the accommodating number of components in the one component accommodating body, after the integration process, exceeds a limit accommodation number, or
  - when integration is prohibited to the one component accommodating body that is a target of the integration process.

11. The component accommodating body storeroom of claim 9,
- wherein the component accommodating body is one of a plurality of reels that holds a carrier tape for housing the component in a wound state, and
- wherein the integration processor performs a splicing process of joining the carrier tapes held by the plurality of respective reels.

12. The component accommodating body storeroom of claim 11,
- wherein the management storage further stores a model of a component supply device that supplies the component accommodated in the component accommodating body to the mounter, and
- wherein the controller controls the transporter such that the component accommodating body is not transported to the integration processor when the model of the component supply device does not accept a carrier tape subjected to the splicing process.

13. The component accommodating body storeroom of claim 9,
- wherein the controller controls the transporter such that a component accommodating body with an older component loading date and time is prioritized, of the plurality of component accommodating bodies, and is transported to the integration processor in order to be integrated with the one component accommodating body that is to be stored in the component accommodating body storeroom.

14. The component accommodating body storeroom of claim 9,
- wherein the controller controls the transporter such that a component accommodating body which accommodates a component with a short expiration date is prioritized, of the plurality of component accommodating bodies, and is transported to the integration processor in order to be integrated with the one component accommodating body that is to be stored in the component accommodating body storeroom.

15. The component accommodating body storeroom of claim 8, further comprising:
- a preparation component extractor that extracts a component type of a component to be prepared and the preparing number of components from production planning information including a component type and the production number of mounting boards that are produced by the mounter,
- wherein the controller controls the transporter based on the extracted component type and the preparing number of components.

16. A component storage instructing method in a component accommodating body managing apparatus that includes
- a management storage that stores a component type and an accommodating number of components in a component accommodating body stored in a component accommodating body storeroom, wherein the accommodating number of components is the number of components accommodated in a component accommodating body that is to be stored in the component accommodating body storeroom,
- the method comprising:
- a preparation component extracting step of extracting a component type and a preparing number of components to be prepared, from production planning information including a component type of a component that is to be mounted on a mounting board and the production number of mounting board; and
- a storage instructing step of generating and transmitting storage instruction of the component accommodating body that is to be stored into the component accommodating body storeroom, based on the preparing number of components and the accommodating number of components
- wherein, in the storage instructing step, the instruction is generated such that the accommodating number of components satisfies the preparing number of components by having the accommodating number of components equal to or more than the preparing number of components.

* * * * *